US009464172B2

(12) United States Patent
Ide et al.

(10) Patent No.: US 9,464,172 B2
(45) Date of Patent: *Oct. 11, 2016

(54) ALKALI-DEVELOPABLE CURABLE COMPOSITION, INSULATING THIN FILM USING THE SAME, AND THIN FILM TRANSISTOR

(75) Inventors: Masahito Ide, Settsu (JP); Takao Manabe, Settsu (JP); Makoto Seino, Settsu (JP)

(73) Assignee: Kaneka Corporation, Osaka (JP)

( * ) Notice: Subject to any disclaimer, the term of this patent is extended or adjusted under 35 U.S.C. 154(b) by 902 days.

This patent is subject to a terminal disclaimer.

(21) Appl. No.: 12/746,891

(22) PCT Filed: Dec. 5, 2008

(86) PCT No.: PCT/JP2008/072181
§ 371 (c)(1),
(2), (4) Date: Sep. 8, 2010

(87) PCT Pub. No.: WO2009/075233
PCT Pub. Date: Jun. 18, 2009

(65) Prior Publication Data
US 2011/0001190 A1 Jan. 6, 2011

(30) Foreign Application Priority Data

Dec. 10, 2007 (JP) ................. 2007-318932
Dec. 28, 2007 (JP) ................. 2007-339485
Jul. 7, 2008 (JP) ................. 2008-177079

(51) Int. Cl.
| | | |
|---|---|---|
| *C07D 251/32* | (2006.01) | |
| *C07D 251/34* | (2006.01) | |
| *C08G 77/388* | (2006.01) | |
| *C08K 5/3492* | (2006.01) | |
| *C08L 83/06* | (2006.01) | |
| *G03F 7/075* | (2006.01) | |
| *H01L 21/312* | (2006.01) | |
| *H01L 29/786* | (2006.01) | |
| *H01L 21/02* | (2006.01) | |
| *H01L 23/29* | (2006.01) | |
| *H01L 29/49* | (2006.01) | |
| *H01L 51/05* | (2006.01) | |
| *C08K 5/549* | (2006.01) | |
| *H01L 27/12* | (2006.01) | |

(52) U.S. Cl.
CPC ........... *C08G 77/388* (2013.01); *G03F 7/0755* (2013.01); *G03F 7/0757* (2013.01); *H01L 21/02126* (2013.01); *H01L 21/02216* (2013.01); *H01L 21/02219* (2013.01); *H01L 21/02282* (2013.01); *H01L 21/02343* (2013.01); *H01L 21/02348* (2013.01); *H01L 21/3122* (2013.01); *H01L 23/296* (2013.01); *H01L 29/4908* (2013.01); *H01L 29/78609* (2013.01); *H01L 51/052* (2013.01); *C08K 5/549* (2013.01); *H01L 27/1248* (2013.01); *H01L 29/7869* (2013.01); *H01L 2924/0002* (2013.01); *H01L 2924/12044* (2013.01)

(58) Field of Classification Search
CPC .............. C07D 251/32; C07D 251/34; C08K 5/34922; C08L 83/08; G03F 7/075; H01L 21/3122; H01L 29/786
USPC .......... 544/221; 525/100, 477, 478; 428/447
See application file for complete search history.

(56) References Cited

U.S. PATENT DOCUMENTS

| | | |
|---|---|---|
| 3,159,601 A | 12/1964 | Ashby |
| 3,159,662 A | 12/1964 | Ashby |
| 3,220,972 A | 11/1965 | Lamoreaux |
| 3,379,653 A | 4/1968 | Ernst et al. |
| 3,516,946 A | 6/1970 | Modic |
| 3,517,001 A | 6/1970 | Berger |
| 3,586,616 A | 6/1971 | Kropp |
| 3,708,296 A | 1/1973 | Schlesinger |
| 3,821,218 A | 6/1974 | Berger |

(Continued)

FOREIGN PATENT DOCUMENTS

| | | |
|---|---|---|
| CN | 1649964 | 8/2005 |
| EP | 0 399 199 | 11/1990 |

(Continued)

OTHER PUBLICATIONS

Authorized Officer Masashi Honda, English translation of the International Preliminary Report on Patentability (Chapter I), issued in International Application No. PCT/JP2008/072181, Aug. 10, 2010.

(Continued)

*Primary Examiner* — Venkataraman Balasubramanian
(74) *Attorney, Agent, or Firm* — Hamre, Schumann, Mueller & Larson, P.C.

(57) ABSTRACT

An object of the present invention is to provide a polysiloxane compound that can be developed in an aqueous alkali solution and can yield a cured product or thin film having superior heat-resistant transparency and insulating properties, a curable composition thereof, and a thin film transistor provided with a passivation layer or gate insulator using the same, and the present invention relates to a polysiloxane compound having at least one photopolymerizable functional group in a molecule thereof, and having at least one member selected from the group consisting of an isocyanuric acid backbone structure, a phenolic hydroxyl group and a carboxyl group within the same molecule, to a curable composition containing the polysiloxane compound, and to a cured product thereof.

18 Claims, No Drawings

(56) References Cited

U.S. PATENT DOCUMENTS

| | | | |
|---|---|---|---|
| 3,892,643 A | 7/1975 | Tanaka et al. | |
| 3,896,123 A | 7/1975 | DeZuba et al. | |
| 4,058,400 A | 11/1977 | Crivello | |
| 4,069,055 A | 1/1978 | Crivello | |
| 4,086,091 A | 4/1978 | Cella | |
| 4,139,655 A | 2/1979 | Tsao | |
| 4,161,478 A | 7/1979 | Crivello | |
| 4,231,951 A | 11/1980 | Smith et al. | |
| 4,256,828 A | 3/1981 | Smith | |
| 4,406,807 A | 9/1983 | Renner et al. | |
| 4,640,967 A | 2/1987 | Eckberg | |
| 4,943,601 A | 7/1990 | Dinallo, Sr. | |
| 4,987,158 A | 1/1991 | Eckberg | |
| 5,037,861 A | 8/1991 | Crivello et al. | |
| 5,101,029 A | 3/1992 | Stapp et al. | |
| 5,198,520 A | 3/1993 | Onishi et al. | |
| 5,204,408 A | 4/1993 | Konno et al. | |
| 5,240,971 A | 8/1993 | Eckberg et al. | |
| 5,268,396 A | 12/1993 | Lai | |
| 5,296,298 A | 3/1994 | Fujimoto et al. | |
| 5,391,678 A | 2/1995 | Bard et al. | |
| 5,409,995 A | 4/1995 | Iwahara et al. | |
| 5,523,374 A | 6/1996 | Bard et al. | |
| 5,580,925 A | 12/1996 | Iwahara et al. | |
| 5,652,276 A | 7/1997 | Ando et al. | |
| 5,684,110 A | 11/1997 | Kawamura | |
| 5,721,291 A | 2/1998 | Gaulle et al. | |
| 6,037,043 A | 3/2000 | Lehner et al. | |
| 6,187,890 B1 | 2/2001 | Fehn et al. | |
| 6,194,482 B1 | 2/2001 | Lehner et al. | |
| 6,355,946 B1 | 3/2002 | Ishinaga | |
| 6,592,999 B1 | 7/2003 | Anderson et al. | |
| 6,791,259 B1 | 9/2004 | Stokes et al. | |
| 7,371,462 B2* | 5/2008 | Tsumura et al. | 428/447 |
| 7,785,715 B2* | 8/2010 | Tsumura et al. | 428/447 |
| 8,263,725 B2* | 9/2012 | Ichiryu et al. | 528/27 |
| 8,809,414 B2* | 8/2014 | Ide et al. | 522/99 |
| 2002/0156186 A1 | 10/2002 | Bublewitz et al. | |
| 2003/0144420 A1 | 7/2003 | Tsumura et al. | |
| 2003/0232222 A1 | 12/2003 | Anderson et al. | |
| 2004/0126504 A1 | 7/2004 | Ouchi et al. | |
| 2005/0042463 A1 | 2/2005 | Anderson et al. | |
| 2005/0171318 A1 | 8/2005 | Okuhira et al. | |
| 2005/0209400 A1* | 9/2005 | Tsumura et al. | 525/100 |
| 2009/0162782 A1 | 6/2009 | Takei et al. | |
| 2010/0222525 A1 | 9/2010 | Ichiryu et al. | |

FOREIGN PATENT DOCUMENTS

| | | |
|---|---|---|
| EP | 0 803 529 | 10/1997 |
| EP | 1 369 458 | 12/2003 |
| EP | 1 505 121 | 2/2005 |
| JP | 50-000100 | 1/1975 |
| JP | 59-155483 | 9/1984 |
| JP | 61-118746 | 6/1986 |
| JP | 62-207333 | 9/1987 |
| JP | 3-002189 | 1/1991 |
| JP | 3-014838 | 1/1991 |
| JP | 3-247686 | 11/1991 |
| JP | 4-218051 | 8/1992 |
| JP | 4-222817 | 8/1992 |
| JP | 5-140459 | 6/1993 |
| JP | 6-263989 | 9/1994 |
| JP | 8-157720 | 6/1996 |
| JP | 8-183934 | 7/1996 |
| JP | 9-291214 | 11/1997 |
| JP | 9-316293 | 12/1997 |
| JP | 10-003270 | 1/1998 |
| JP | 2000-124475 | 4/2000 |
| JP | 2000-183407 | 6/2000 |
| JP | 2000-344895 | 12/2000 |
| JP | 2001-011210 | 1/2001 |
| JP | 2001-019742 | 1/2001 |
| JP | 2001-118865 | 4/2001 |
| JP | 3203843 | 6/2001 |
| JP | 2001-207059 | 7/2001 |
| JP | 2001-513117 | 8/2001 |
| JP | 2002-080733 | 3/2002 |
| JP | 2002-194215 | 7/2002 |
| JP | 2002-217459 | 8/2002 |
| JP | 2002-235005 | 8/2002 |
| JP | 3354973 B2 | 9/2002 |
| JP | 2002-314140 | 10/2002 |
| JP | 2002-317048 | 10/2002 |
| JP | 2002-324920 | 11/2002 |
| JP | 2002-338833 | 11/2002 |
| JP | 2003-113310 | 4/2003 |
| JP | 2003-128921 | 5/2003 |
| JP | 2003-261770 | 9/2003 |
| JP | 2003-261783 | 9/2003 |
| JP | 2003-268239 | 9/2003 |
| JP | 2003-292568 | 10/2003 |
| JP | 2004-002783 | 1/2004 |
| JP | 2004-099751 | 4/2004 |
| JP | 2004-143449 | 5/2004 |
| JP | 2004-196958 | 7/2004 |
| JP | 2004-212983 | 7/2004 |
| JP | 2004-238589 | 8/2004 |
| JP | 2004-349319 | 12/2004 |
| JP | 2004-359933 | 12/2004 |
| JP | 2005-23256 | 1/2005 |
| JP | 2005-266673 | 9/2005 |
| JP | 2006-008740 | 1/2006 |
| JP | 2006-241462 | 9/2006 |
| JP | 2006-269402 | 10/2006 |
| JP | 2006-291044 | 10/2006 |
| JP | 2007-43055 | 2/2007 |
| JP | 2007-158147 | 6/2007 |
| JP | 2007-258663 | 10/2007 |
| JP | 2007-293160 | 11/2007 |
| JP | 2008-274004 | 11/2008 |
| JP | 2008-291137 | 12/2008 |
| JP | 2009-062490 | 3/2009 |
| JP | 4611617 B | 1/2011 |
| JP | 4685690 B | 5/2011 |
| JP | 4694371 B | 6/2011 |
| JP | 5117799 B2 | 1/2013 |
| KR | 10-2005-0112097 | 11/2005 |
| TW | 200734825 | 9/2007 |
| WO | 01/81475 | 11/2001 |
| WO | 02/053648 | 7/2002 |
| WO | 03/091338 | 6/2003 |
| WO | 2007/074813 | 12/2006 |
| WO | 2007/097212 | 8/2007 |
| WO | 2008/010545 | 1/2008 |
| WO | 2008/133138 | 11/2008 |
| WO | 2009/075233 | 6/2009 |

OTHER PUBLICATIONS

George Wypych, Handbook of Fillers, 2000, Chem Tec, $2^{nd}$ Edition, p. 246.

Salmone, Polymeric Materials Encyclopedia, vol. 7, Jul. 1996, CRC, $1^{st}$ Edition, p. 1322.

"Fira Handbook", edited by the Society of Rubber Industry, Japan Gomu Kogyo Gitutsu Iinkai, et al., Taisei-sha Kabushiki Kaisha, 1987, pp. 198-218.

Manabu Kiyono, "Sanka Titanium Bussei to Oyo Gijutsu", Gihodo Shuppan Co., Ltd., 1991, pp. 75-155.

Watt, et al., "A Novel Photoinitiator of Cationic Polymerization: Preparation and Characterization of Bis [4-(diphenylsulfonio)phenyl]sulfide-Bis-Hexafluorophosphate", Journal of Polymer Science, 1984, pp. 1789-1796, vol. 22, Polymer Chemistry Ed.

* cited by examiner

ALKALI-DEVELOPABLE CURABLE COMPOSITION, INSULATING THIN FILM USING THE SAME, AND THIN FILM TRANSISTOR

TECHNICAL FIELD

The present invention relates to a polysiloxane compound, a curable composition using that compound, a cured product, an alkali-developable resist using the same, and a thin film transistor using the same as a passivation layer or gate insulator.

BACKGROUND ART

Studies have been conducted on the application of polyhedral structure-containing polysiloxane compounds having various types of functional groups to electronic components and semiconductor components and the like since the transparency of their resulting cured products is high and they are materials having high reliability such as favorable heat resistance and light resistance (see, for example, Patent Documents 1 to 4).

One example of applications of these materials is a resist material. Various polysiloxane-based materials have been used for this application in the past. When the above-mentioned polyhedral structure-containing polysiloxane compounds having high reliability is applied, it is necessary to impart alkali solubility.

A method comprising introduction of organic acid groups is known as a typical method for imparting alkali solubility. However, this method has a potential problem of causing decreases in the heat resistance and light resistance inherently possessed by polyhedral structure-containing polysiloxane compounds, along with introduction of organic acid groups.

On the other hand, examples of patterning materials that have conventionally been used as alkali-developable resist materials include resins having acidic groups such as novolak resin, acrylic acid copolymers and polyamide acid (see, for example, Patent Documents 5 to 7).

However, in processes in which these resins are exposed to high temperatures such as during electronic component mounting, they lack reliability (in terms of, for example, thermal decomposition, cracking and separation) and transparency at high temperatures, and are unable to satisfy requirements.

In the field of thin film transistors (TFT) widely used to drive liquid crystal displays (LCD) and the like, oxide semiconductor and organic semiconductor materials are attracting attention and being actively researched and developed as next-generation transistor technologies. This is because semiconductor layers can now be formed at low temperatures and by easier methods such as printing methods and therefore TFT may be expanded into flexible displays and the like. In order to form these next-generation transistors, technologies and materials are being earnestly sought that similarly allow the formation of insulators at low temperatures and using a simple solution process. In this field as well, if alkali-developable materials can be used for the insulators, it will offer the advantage of simplifying contact hole formation and other patterning. On the basis of this background, gate insulators for organic TFT have been attempted to be formed from organic materials such as polyvinyl alcohols, epoxy resin or silicon-based polymers. However, gate insulators using these organic materials have inferior insulating properties in comparison with inorganic insulators obtained by CVD, and an effective insulator material has yet to be obtained that allows low-temperature formation.

Patent Document 1: Japanese Patent Application Laid-open No. 2004-359933
Patent Document 2: Japanese Patent Application Laid-open No. 2004-143449
Patent Document 3: Japanese Patent Application Laid-open No. 2006-269402
Patent Document 4: Japanese Patent Application Laid-open No. 2005-23256
Patent Document 5: Japanese Patent No. 3203843
Patent Document 6: Japanese Patent Application Laid-open No. 2005-266673
Patent Document 7: Japanese Patent Application Laid-open No. H4-218051
Patent Document 8: Japanese Patent Application Laid-open No. 2004-349319
Patent Document 9: Japanese Patent Application Laid-open No. 2007-158147
Patent Document 10: Japanese Patent Application Laid-open No. 2007-43055

SUMMARY OF THE INVENTION

With the foregoing in view, an object of the present invention is to provide a polysiloxane compound that can be developed in an aqueous alkali solution and can yield a cured product having superior heat-resistant transparency, and a curable composition thereof. In addition, an object of the present invention is to provide a thin film that can be formed by solution coating and has superior insulating properties, and a thin film transistor provided with a passivation layer or gate insulator using the thin film.

As a result of conducting intensive investigations in consideration of the above, the inventors of the present invention found that the above-mentioned problems can be solved by using a polysiloxane compound having a photopolymerizable functional group in a molecule thereof and a specific structure for imparting alkali solubility, thereby leading to completion of the present invention.

The present invention relates to a polysiloxane compound, having at least one photopolymerizable functional group in a molecule thereof, and having at least one member selected from the group consisting of structures represented by the following formulas (X1) to (X3), a phenolic hydroxyl group, and a carboxyl group within the same molecule.

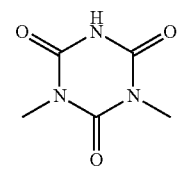

(X1)

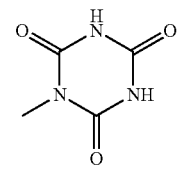

(X2)

-continued

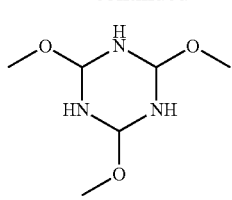
(X3)

The photopolymerizable functional group is preferably at least one member selected from the group consisting of an epoxy group, a crosslinkable silicon group and a (meth)acryloyl group.

At least one of the photopolymerizable functional group is preferably an alicyclic epoxy group, a glycidyl group, or an alkoxysilyl group.

The alkoxysilyl group is preferably an alkoxysilylethyl group or an alkoxysilylpropyl group. Specifically, the alkoxysilyl group is preferably at least one member selected from the group consisting of an (alkoxysilylethyl)dimethylsilyl group, (alkoxysilylethyl) diphenylsilyl group, (alkoxysilylpropyl) dimethylsilyl group and (alkoxysilylpropyl) diphenyl group.

Examples of the polysiloxane compound include hydrosilylation reaction products of the following compounds (α1) to (γ1):

(α1) an organic compound having, in a molecule thereof, one or more carbon-carbon double bonds that have reactivity with SiH groups, and having, within the same molecule, at least one member selected from the group consisting of structures represented by the following formulas (X1) to (X3), a phenolic hydroxyl group, and a carboxyl group;

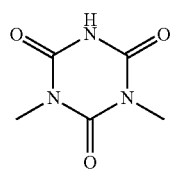
(X1)

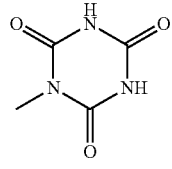
(X2)

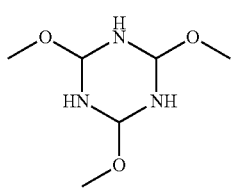
(X3)

(β) a polysiloxane compound having at least two SiH groups in a molecule thereof; and (γ1) a compound having, in a molecule thereof, at least one photopolymerizable functional group and one or more carbon-carbon double bonds that have reactivity with SiH groups.

Examples of the polysiloxane compound include hydrosilylation reaction products of the following compounds (α1) to (γ1):

(α1) an organic compound having, in a molecule, thereof one or more carbon-carbon double bonds that have reactivity with SiH groups, and having, within the same molecule, at least one member selected from the group consisting of structures represented by the following formulas (X1) to (X3), a phenolic hydroxyl group, and a carboxyl group;

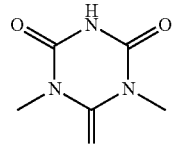
(X1)

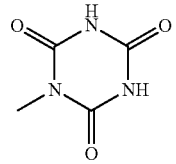
(X2)

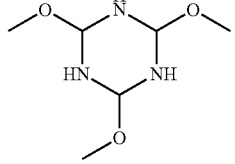
(X3)

(α2) a compound having, in a molecule thereof, one or more carbon-carbon double bonds that have reactivity with SiH groups;

(β) a polysiloxane compound having at least two SiH groups in a molecule thereof; and (γ1) a compound having, in a molecule thereof, at least one photopolymerizable function group and one or more carbon-carbon double bonds that have reactivity with SiH groups.

The compound (α1) is preferably at least one member selected from the group consisting of compounds represented by the following general formulas (I):

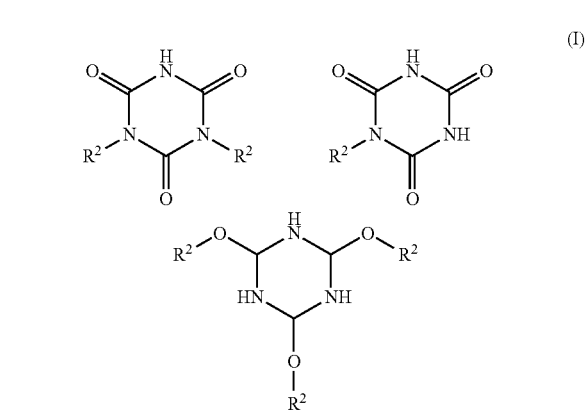
(I)

wherein, $R^2$ represents a monovalent organic group having 1 to 50 carbon atoms, each $R^2$ may be the same or different, and at least one $R^2$ contains a carbon-carbon double bond that has reactivity with SiH groups.

The compound (α1) is preferably at least one member selected from the group consisting of diallyl isocyanuric acid, monoallyl isocyanuric acid, diallyl bisphenol A, diallyl bisphenol S, vinyl phenol, allyl phenol, butenoic acid, pentenoic acid, hexenoic acid, heptenoic acid and undecylenic acid.

The compound (α2) is preferably a compound represented by the following general formula (II):

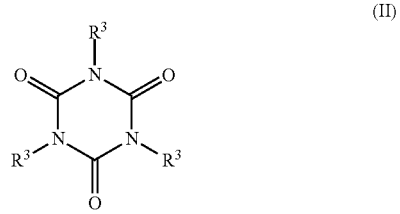

wherein, $R^3$ represents a monovalent organic group having 1 to 50 carbon atoms, each $R^3$ may be the same or different, and at least one $R^3$ contains a carbon-carbon double bond that has reactivity with SiH groups.

The compound (β) is preferably a cyclic polysiloxane compound having an SiH group represented by the following general formula (III):

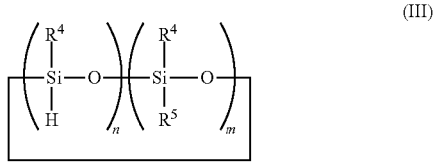

wherein, $R^4$ and $R^5$ represent organic groups having 1 to 10 carbon atoms and may be the same or different, n represents a number of 1 to 10, and m represents a number of 0 to 10.

Examples of the compound (γ1) include: at least one member selected from the group consisting of vinylcyclohexene oxide, allyl glycidyl ether, diallyl monoglycidyl isocyanurate and monoallyl diglycidyl isocyanurate; a compound represented by the following general formula (IV):

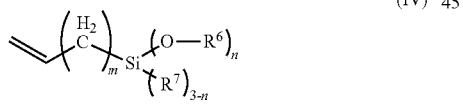

wherein, $R^6$ and $R^7$ each represent an organic group having 1 to 6 carbon atoms, n represents a number of 1 to 3 and m represents a number of 0 to 10; and allyl(meth)acrylate and/or vinyl (meth)acrylate.

The polysiloxane compound may have a polysiloxane structure having a polyhedral backbone formed from 6 to 24 Si atoms in a molecule thereof.

The curable composition of the present invention comprises the polysiloxane compound.

The curable composition may further comprise a cationic polymerization initiator and/or a radical polymerization initiator.

The curable composition may further comprise a photoacid generator.

The photoacid generator is preferably an onium salt.

The curable composition may further comprise a sensitizer.

The cured product of the present invention is obtained by curing the curable composition.

The laminate of the present invention is obtained by coating and curing the curable composition on a base material.

The alkali-developable resist of the present invention is produced using the curable composition.

In the thin film transistor of the present invention, a passivation layer of a semiconductor layer is produced from the curable composition.

In the thin film transistor of the present invention, a gate insulator is produced from the curable composition.

The resin film of the present invention has insulating properties such that a resin layer thereof formed at a thickness of 1 μm between metal electrodes has a leakage current of 10 nA/cm² or less when a voltage of 30 V is applied.

The resin film may be formed by coating a resin solution.

The resin film is preferably produced from a resin composition containing a polysiloxane compound as a main component thereof.

The polysiloxane compound of the resin film preferably has a cyclic polysiloxane structure formed from 3 to 10 Si atoms in a molecule thereof.

The polysiloxane compound of the resin film may have a polysiloxane structure having a polyhedral backbone formed from 6 to 24 Si atoms in a molecule thereof.

The resin composition may have alkali developability.

The resin composition may be the curable composition.

In the thin film transistor of the present invention, a passivation layer of a semiconductor layer may be the resin film.

In the thin film transistor of the present invention, a gate insulator may be the resin film.

According to the present invention, a novel photo-curable polysiloxane compound which can yield a cured product having superior heat-resistant transparency, and is soluble in an aqueous alkali solution, and a curable composition thereof, can be provided. In addition, according to the present invention, a thin resin film having superior electrical insulating properties, and a thin film transistor provided with a passivation layer or gate insulator using the thin resin film, can be obtained.

BEST MODE FOR CARRYING OUT THE INVENTION

First, the following provides an explanation of the polysiloxane compound of the present invention.

<Polysiloxane Compound>

The polysiloxane compound of the present invention (which may also be referred to as a "modified polyorganosiloxane compound") can be dissolved in an aqueous alkali solution and can be applied as an alkali-developable resist material as a result of having at least one member selected from the group consisting of structures represented by the following formulas (X1) to (X3):

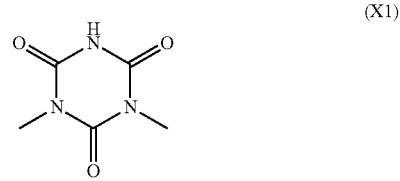

and a phenolic hydroxyl group and a carboxyl group (hereinafter, "the structures represented by the above-mentioned formulas (X1) to (X3), the phenolic hydroxyl group and the carboxyl group" may be referred to as "acidic groups") within the same molecule.

From the viewpoint of the resulting cured product demonstrating a little coloring after heating, the carboxyl group and the structures represented by the above-mentioned formulas (X1) to (X3) among these organic structures are preferable, and from the additional viewpoint of allowing the obtaining of a cured product having a low degree of thermal decomposition at high temperatures, a polysiloxane compound having each of the structures represented by the above-mentioned formulas (X1) to (X3) is particularly preferable. The polysiloxane compound of the present invention further has at least one photopolymerizable functional group in a molecule thereof. Here, the photopolymerizable functional group refers to a functional group that undergoes polymerization or crosslinking by a radical or cation species generated by a photopolymerization initiator when subjected to light energy from the outside, and there are no particular limitations on the type of reaction or crosslinking.

From the viewpoints of reactivity and compound stability in particular, at least one photopolymerizable functional group is preferably an epoxy group, crosslinkable silicon group (which may also be referred to as a "hydrolyzable silyl group"), (meth)acryloyl group and/or vinyloxy group. Among epoxy groups, from the viewpoint of stability, an alicyclic epoxy group and a glycidyl group are preferable. An alicyclic epoxy group is particularly preferable with respect to its superior cationic polymerizability by light and heat.

Examples of crosslinkable silicon groups include hydrolyzable silicon groups such as an alkoxysilyl group, acetoxysilyl group, phenoxysilyl group, silanol group and chlorosilyl group, and from the viewpoints of availability and compound stability in particular, an alkoxysilyl group is particularly preferable. Examples of alkoxysilyl groups include those in which the functional group bonded to silicon is a methoxy group, ethoxy group, n-propoxy group, iso-propoxy group, n-butoxy group, sec-butoxy group or tert-butoxy group, and from the viewpoint of less likelihood of residual components remaining after curing, a methoxy group and an ethoxy group are particularly preferable.

From the viewpoint of reactivity, the crosslinkable silicon group is preferably an alkoxysilylethyl group or alkoxysilylpropyl group, and more specifically, an (alkoxysilylethyl)dimethylsilyl group, (alkoxysilylethyl)diphenylsilyl group, (alkoxysilylpropyl)dimethylsilyl group or (alkoxysilylpropyl)diphenyl group is preferable.

Although the polysiloxane compound of the present invention has at least one photopolymerizable functional group in a molecule thereof, it preferably has two or more, and more preferably has three or more. If it has three or more such groups, there is the advantage of allowing the obtaining of a cured product having a high degree of crosslinking and having superior heat resistance. Each photopolymerizable functional group may be the same, or two or more different types of functional groups may be present.

There are no particular limitations on the polysiloxane compound of the present invention provided it has a siloxane unit Si—O—Si. Among the siloxane units present in the compound, the higher the content of T unit ($XSiO_{3/2}$) or Q unit ($SiO_{4/2}$) among the constituent components thereof, the higher the hardness and the better the heat-resistant reliability of the resulting cured product, while the higher the content of M unit ($X_3SiO_{1/2}$) or D unit ($X_2SiO_{2/2}$), the greater the flexibility and the lower the stress of the cured product.

The polysiloxane compound of the present invention can be applied as an alkali-developable resist material by introducing the above-mentioned acidic group structure and photocrosslinkable functional group into polysiloxane. Although there are no particular limitations on the method used to introduce the above-mentioned acidic group structure and photocrosslinkable functional group into polysiloxane, a hydrosilylation reaction, which enables the structure and group to be introduced with chemically stable Si—C bonds, is used preferably.

Preferable aspects of the polysiloxane compound of the present invention include the three aspects indicated below.

A first preferable aspect is a hydrosilylation reaction product of the following compounds (α1), (β) and (γ1):

(α1) an organic compound having, in a molecule thereof, one or more carbon-carbon double bonds that have reactivity with SiH groups, and having, within the same molecule, at least one member selected from the group consisting of structures represented by the above-mentioned formulas (X1) to (X3), a phenolic hydroxyl group, and a carboxyl group;

(β) a polysiloxane compound having at least two SiH groups in a molecule thereof; and (γ1) a compound having, in a molecule thereof, at least one photopolymerizable functional group and one or more carbon-carbon double bonds that have reactivity with SiH groups.

A second preferable aspect is a hydrosilylation reaction product of the following compounds (α1), (α2), (β3) and (γ1):

(α1) an organic compound having, in a molecule thereof, one or more carbon-carbon double bonds that have reactivity with SiH groups, and having, within the same molecule, at least one member selected from the group consisting of structures represented by the above-mentioned formulas (X1) to (X3), a phenolic hydroxyl group, and a carboxyl group;

(α2) a compound having, in a molecule thereof, one or more carbon-carbon double bonds that have reactivity with SiH groups;

(β) a polysiloxane compound having at least two SiH groups in a molecule thereof; and (γ1) a compound having, in a molecule thereof, at least one photopolymerizable function group and one or more carbon-carbon double bonds that have reactivity with SiH groups.

A third preferable aspect is a hydrosilylation reaction product of the following compounds (α3), (α4) and (γ2):

(α3) a compound having, in a molecule thereof, two or more carbon-carbon double bonds that have reactivity with SiH groups;

(α4) a compound having one or more SiH groups in a molecule thereof, and having, within the same molecule, at least one member selected from the group consisting of structures represented by the above-mentioned formulas (X1) to (X3), a phenolic hydroxyl group and a carboxyl group; and (γ2) a compound having, in a molecule thereof, at least one photopolymerizable functional group and one or more SiH groups.

The following provides an explanation of the above-mentioned preferable aspects of the polysiloxane compound.

(Compound (α1))

There are no particular limitations on compound (α1) provided it is an organic compound having any structure selected from the group consisting of structures represented by the above-mentioned formulas (X1) to (X3), a phenolic hydroxyl group and a carboxyl group in a molecule thereof, and having, within the same molecule, one or more carbon-carbon double bonds that have reactivity with SiH groups.

Preferably, the organic compound is not that which contains a siloxane unit (Si—O—Si) in the manner of a polysiloxane-organic block copolymer or polysiloxane-organic graft copolymer, but is that which contains, as constituent elements thereof, elements exclusively selected from the group consisting of C, H, N, O, S and halogens. Gas permeability and cissing become problems in the case of containing a siloxane unit.

There are no particular limitations on the location of the carbon-carbon double bond having reactivity with SiH groups, and it may be present anywhere within the molecule.

There are no particular limitations on the carbon-carbon double bond having reactivity with SiH groups of compound (α1) and any carbon-carbon double bond can be used, examples of which include a vinyl group, allyl group, methallyl group, acrylic group, methacrylic group, 2-hydroxy-3-(allyloxy) propyl group, 2-allylphenyl group, 3-allylphenyl group, 4-allylphenyl group, 2-(allyloxy)phenyl group, 3-(allyloxy)phenyl group, 4-(allyloxy)phenyl group, 2-(allyloxy)ethyl group, 2,2-bis(allyloxymethyl) butyl group, 3-allyloxy-2,2-bis(allyloxymethyl) propyl group and vinyl ether group. A vinyl group, allyl group and the like are particularly preferable from the viewpoint of reactivity.

Although compound (α1) has one or more carbon-carbon double bonds having reactivity with SiH groups in a molecule thereof, it preferably has two or more, and more preferably three or more, of such carbon-carbon double bonds from the viewpoint of high heat-resistant reliability due to the high crosslinked density of the resulting cured product.

Although there are no particular limitations on the compound (α1), at least one member of compounds represented by the following general formulas (I) having an isocyanuric ring:

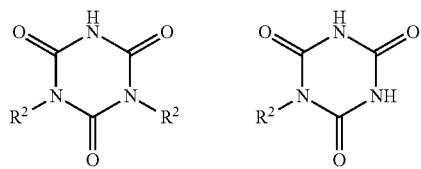 (I)

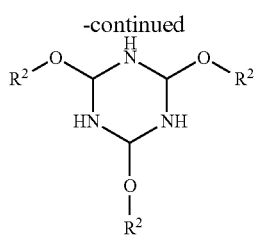

(wherein, R² represents a monovalent organic group having 1 to 50 carbon atoms, each R² may be the same or different, and at least one R² contains a carbon-carbon double bond that has reactivity with SiH groups) is used preferably from the viewpoint of low levels of coloring at high temperatures.

Examples of the above-mentioned organic group include a hydrocarbon group (which may be partially substituted with oxygen) and epoxy group, and from the viewpoint of availability, a phenyl group, methyl group, ethyl group, propyl group, benzyl group or glycidyl group is preferable. Preferable examples of organic groups having a carbon-carbon double bond that has reactivity with SiH groups include an allyl group and a vinyl group.

From the viewpoint of availability, diallyl isocyanuric acid, monoallyl isocyanuric acid, vinyl phenol, allyl phenol,

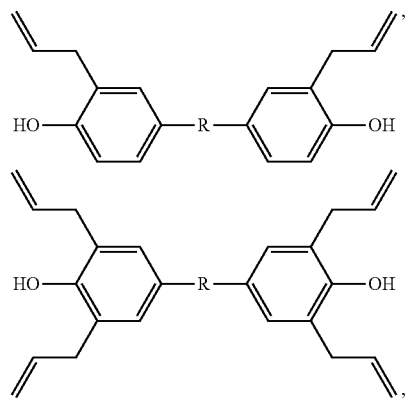

(Wherein R represents a divalent group selected from

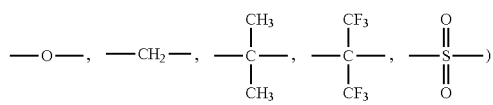)

butenoic acid, pentenoic acid, hexenoic acid, heptenoic acid and undecylenic acid are preferable. From the viewpoint of heat resistance in particular, diallyl isocyanuric acid, monoallyl isocyanuric acid, diallyl bisphenol A, diallyl bisphenol S, vinyl phenol and allyl phenol are more preferable among these examples, and from the viewpoint of transparency of the cured product, diallyl isocyanuric acid and monoallyl isocyanuric acid are particularly preferable.

Compound (α1) can be used as a single species or two or more species thereof can be used.

(Compound (α2))

There are no particular limitations on compound (α2) provided it is a compound that has, in a molecule thereof, one or more carbon-carbon double bonds having reactivity with SiH groups and that neither belongs to the above-mentioned compound (α1) nor to the compound (γ1) to be subsequently described.

From the viewpoint of high heat resistance of the resulting cured product, a polysiloxane having at least one alkenyl group is preferable, and specific examples of polysiloxanes that can be used include alkenyl group-containing polysiloxanes having a linear structure, polysiloxanes having an alkenyl group on the end of a molecule thereof, and cyclic siloxane compounds containing an alkenyl group, and although these polysiloxanes are not particularly limited by the structure thereof, in consideration of heat resistance, light resistance, chemical stability and the like, an alkenyl group-containing polysiloxane having a polyhedral backbone is preferable.

Specific examples of the alkenyl group-containing polysiloxanes having a linear structure include copolymers of a dimethylsiloxane unit, methylvinylsiloxane unit and terminal trimethylsiloxy unit, copolymers of a diphenylsiloxane unit, methylvinylsiloxy unit and terminal trimethylsiloxy unit, copolymers of a methylphenylsiloxane unit, methylvinylsiloxane unit and terminal trimethylsilyoxy unit, and polysiloxanes in which an end thereof is blocked with a dimethylvinylsilyl group.

Specific examples of the polysiloxanes having an alkenyl group on the end of a molecule thereof include the previously exemplified polysiloxanes in which the end is blocked with a dimethylalkenyl group and polysiloxanes comprising a dimethylalkenylsiloxane unit and at least one siloxane unit selected from the group consisting of $SiO_2$ unit, $SiO_{3/2}$ unit and $SiO$ unit.

Examples of the cyclic siloxane compounds containing an alkenyl group include 1,3,5,7-vinyl-1,3,5,7-tetramethylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, and 1,3,5,7,9,11-hexavinyl-1,3,5,7,9,11-hexamethylcyclosiloxane.

The number of Si atoms contained in the polyhedral backbone of the alkenyl group-containing polysiloxane having a polyhedral structure is preferably 6 to 24, a specific example of which is a silsesquioxane having a polyhedral structure represented by the following structure (a typical example is shown here in which the number of Si atoms is 8).

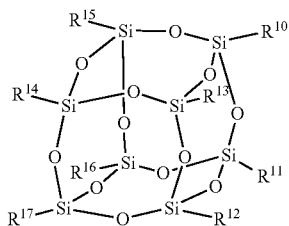

In the above formula, $R^{10}$ to $R^{17}$ represent non-substituted or substituted monovalent hydrocarbon groups, preferably having 1 to 20 carbon atoms and more preferably 1 to 10 carbon atoms and which may be the same or different, selected from alkenyl groups such as a vinyl group, allyl group, butenyl group or hexenyl group, organic groups containing a (meth) acryloyl group, epoxy group, mercapto group or amino group, a hydrogen atom, alkyl groups such as a methyl group, ethyl group, propyl group or butyl group, cycloalkyl groups such as a cyclohexyl group, aryl groups such as a phenyl group or tolyl group, or groups in which all or a portion of the hydrogen atoms bonded to carbon atoms of the foregoing groups are substituted with a halogen atom, cyano group or the like, such as a chloromethyl group, trifluoropropyl group or cyanoethyl group.

However, at least one of $R^{10}$ to $R^{17}$ is an alkenyl group that is a reactive group of the hydrosilylation reaction. Among such alkenyl groups, a vinyl group is preferable from the viewpoint of heat resistance.

The above-mentioned silsesquioxane having a polyhedral structure is obtained by, for example, a hydrolysis-condensation reaction of a silane compound represented by $RSiX_3$ (wherein, R represents the above-mentioned $R^{10}$ to $R^{17}$, and X represents a hydrolyzable functional group such as a halogen atom or alkoxy group).

Alternatively, a method is also known for synthesizing a silsesquioxane having a polyhedral backbone in which, after synthesizing a trisilanol compound having three silanol groups in a molecule thereof by a hydrolysis-condensation reaction of $RSiX_3$, the trisilanol compound is reacted with the same or different trifunctional silane compound to form a closed ring.

A more preferable example of compound (α2) is a silylated silicic acid having a polyhedral structure as represented by the structure indicated below (a typical example is shown here in which the number of Si atoms is 8). In this compound, since Si atoms that form a polyhedral backbone and reactive groups in the form of alkenyl groups are bound together through siloxane bonds, the resulting cured product is not excessively rigid and therefore a satisfactory molded product can be obtained.

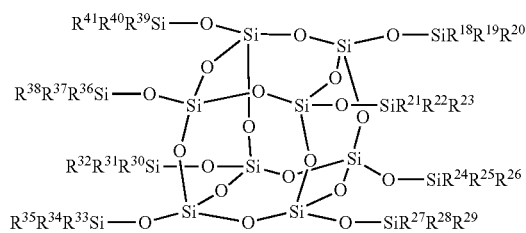

In the above structure, $R^{18}$ to $R^{41}$ represent the same or different organic groups selected from alkenyl groups such as a vinyl group, allyl group, butenyl group or hexenyl group, organic groups containing a (meth)acryloyl group, epoxy group, mercapto group or amino group, a hydrogen atom, alkyl groups such as a methyl group, ethyl group, propyl group or butyl group, cycloalkyl groups such as a cyclohexyl group, aryl groups such as a phenyl group or tolyl group, or groups in which all or a portion of the hydrogen atoms bonded to carbon atoms of the foregoing groups are substituted with a halogen atom, cyano group or the like, such as a chloromethyl group, trifluoropropyl group or cyanoethyl group. However, at least one of $R^{18}$ to $R^{41}$ is an alkenyl group that is a reactive group of the hydrosilylation reaction. Among such alkenyl groups, a vinyl group is preferable from the viewpoint of heat resistance.

There are no particular limitations on the method used to synthesize a silicate having a polyhedral structure, and the silicate can be synthesized using a known method. A specific example of the synthesis method is a method in which a tetraalkoxysilane is hydrolyzed and condensed in the presence of a base such as quaternary ammonium hydroxide. Examples of the tetraalkoxysilane include tetraethoxysilane, tetramethoxysilane and tetrabutoxysilane. Examples of the quaternary ammonium hydroxide include 2-hydroxyethyl trimethyl ammonium hydroxide and tetramethyl ammonium hydroxide. In addition, in the present invention, a silicate having a similar polyhedral structure can also be obtained from silica or silica-containing materials such as rice husks instead of the tetraalkoxysilane.

In the present synthesis method, a silicate having a polyhedral structure can be obtained by a hydrolysis-condensation reaction of a tetraalkoxysilane. Subsequently, by further reacting the resulting silicate with a silylating agent such as an alkenyl group-containing silyl chloride, a polysiloxane can be obtained in which Si atoms that form a polyhedral structure and reactive groups in the form of alkenyl groups are bound together through siloxane bonds.

In the present invention, 6 to 24 Si atoms, and more preferably 6 to 10 Si atoms, can be preferably used as the number of Si atoms contained in the polyhedral backbone. A mixture of polysiloxanes that have polyhedral structures each containing different numbers of Si atoms may also be used. In addition, the number of alkenyl groups contained in a molecule thereof is preferably at least one, more preferably at least two, and even more preferably at least three. In the molecule, groups on Si atoms preferably comprise a vinyl group and a methyl group from the viewpoints of heat resistance and light resistance.

In addition, an organic compound having, in a molecule thereof, one or more carbon-carbon double bonds that have reactivity with SiH groups can also be used from the viewpoint of high adhesion with a base material.

An organic compound having, in a molecule thereof, one or more carbon-carbon double bonds that have reactivity with SiH groups can also be used for compound ($\alpha$2). Such organic compounds referred to here can be classified into organic polymer compounds and organic monomer compounds.

Examples of organic polymer compounds that can be used include polyether, polyester, polyallylate, polycarbonate, saturated hydrocarbon, unsaturated hydrocarbon, polyacrylic acid ester, polyamide, phenol-formaldehyde (or phenol resin) and polyimide compounds.

Examples of the organic monomer compounds include aromatic hydrocarbon compounds such as phenol series, bisphenol series, benzene, and naphthalene; aliphatic hydrocarbon compounds such as linear or alicyclic ones; and heterocyclic compounds; and mixtures thereof.

Specific examples of compound ($\alpha$2) include diallyl phthalate, triallyl trimellitate, diethylene glycol bis(allylcarbonate), trimethylolpropane diallyl ether, trimethylolpropane triallyl ether, pentaerythritol triallyl ether, pentaerythritol tetraallyl ether, 1,1,2,2-tetraallyloxyethane, diallylidene pentaerythritol, triallyl cyanurate, triallyl isocyanurate, diallyl monobenzyl isocyanurate, 1,2,4-trivinylcyclohexane, 1,4-butanediol divinyl ether, nonanediol divinyl ether, 1,4-cyclohexanedimethanol divinyl ether, triethylene glycol divinyl ether, trimethylolpropane trivinyl ether, pentaerythritol tetravinyl ether, diallyl ether of bisphenol S, divinylbenzene, divinylbiphenyl, 1,3-diisopropenylbenzene, 1,4-diisopropenylbenzene, 1,3-bis(allyloxy)adamantane, 1,3-bis(vinyloxy)adamantane, 1,3,5-tris(allyloxy)adamantane, 1,3,5-tris(vinyloxy)adamantane, dicyclopentadiene, vinylcyclohexene, 1,5-hexadiene, 1,9-decadiene, diallyl ether, bisphenol A diallyl ether, 2,5-diallylphenol allyl ether, and oligomers thereof, as well as 1,2-polybutadiene (that in which the ratio of 1 and 2 is 10 to 100% and preferably the ratio of 1 and 2 is 50 to 100%), allyl ether of novolak phenol, allylated polyphenylene oxides, and other compounds obtained by replacing all glycidyl groups of a conventionally known epoxy resin with allyl groups.

As compound ($\alpha$2), low molecular weight compounds, which are difficult to be characterized by the separate viewpoints of a backbone moiety and an alkenyl group (carbon-carbon double bond having reactivity with SiH groups), can also be used. Specific examples of these low molecular weight compounds include aliphatic polyene chain compounds such as butadiene, isoprene, octadiene and decadiene, aliphatic cyclic polyene compounds such as cyclopentadiene, cyclohexadiene, cyclooctadiene, dicyclopentadiene, tricyclopentadiene and norbornadiene, and substituted aliphatic cyclic olefin compounds such as vinylcyclopentene and vinylcyclohexene.

A compound represented by the following general formula (II) is particularly preferable from the viewpoints of high heat resistance and high light resistance.

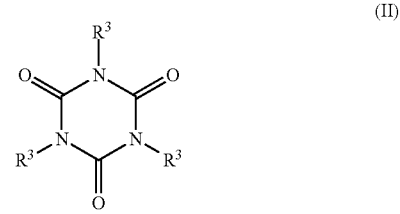

(II)

(wherein, $R^3$ represents a monovalent organic group having 1 to 50 carbon atoms, each $R^3$ may be the same or different, and at least one $R^3$ contains a carbon-carbon double bond having reactivity with SiH groups).

Examples of the above-mentioned organic group include hydrocarbon groups (which may be partially substituted with oxygen). Those having 1 to 20 carbon atoms are preferable, those having 1 to 10 carbon atoms are more preferable, and those having 1 to 4 carbon atoms are even more preferable, from the viewpoint that the resulting cured product may have even higher heat resistance. Preferable examples of these $R^3$s include methyl, ethyl, propyl, butyl, phenyl, benzyl, phenethyl, vinyl and allyl groups.

Specific examples of preferable organic compounds from the viewpoint of availability include triallyl isocyanurate.

The compound ($\alpha$2) can be used as a single species or two or more species thereof can be used.

(Compound ($\alpha$3))

Among the above-mentioned compounds ($\alpha$2), those compounds which have at least two carbon-carbon double bonds having reactivity with SiH groups can be used as compound ($\alpha$3).

The compounds that belong to the above-mentioned compound ($\alpha$2) and have two or more carbon-carbon double bonds can be used without any particular limitations. In addition, compound ($\alpha$3) can be used as a single species or two or more species thereof can be used.

(Compound ($\alpha$4))

There are no particular limitations on compound ($\alpha$4) provided it is a compound that has any structure selected from the group consisting of structures represented by the above-mentioned formulas (X1) to (X3), a phenolic hydroxy group and a carboxyl group in a molecule thereof, and has a hydrosilyl group.

For example, a compounds that is a reaction product obtained by a hydrosilylation reaction of the above-mentioned compound ($\alpha$1) and a polyfunctional hydrosilane compound, and that has at least one hydrosilyl group in a molecule of the reaction product can be used as compound ($\alpha$4).

Examples of the polyfunctional hydrosilane compound include, but are not limited to, poly- or oligosiloxanes in which the end is blocked with a dimethylhydrogensilyl group, such as tetramethyldisiloxane and hexamethyltrisiloxane, and cyclic siloxanes containing a hydrosilyl group, such as 1,3,5,7-tetrahydrogen-1,3,5,7-tetramethylcyclotetrasiloxane, 1-propyl-3,5,7-trihydrogen-1,3,5,7-tetramethylcyclotetrasilo xane, 1,5-dihydrogen-3,7-dihexyl-1,3,5,7-tetramethylcyclotetrasilo xane, 1,3,5-trihydrogen-1,3,5-trimethylcyclosiloxane, 1,3,5,7,9-pentahydrogen-1,3,5,7,9-pentamethylcyclosiloxane, and 1,3,5,7,9,11-hexahydrogen-1,3,5,7,9,11-hexamethylcyclosiloxa ne.

(Compound (β))

There are no particular limitations on compound ((3) provided it is a polysiloxane compound having at least two SiH groups in a molecule thereof, and for example, a compound described in WO 96/15194 having at least two SiH groups in a molecule thereof can be used.

More specifically, hydrosilyl group-containing polysiloxanes having a linear structure, polysiloxanes having a hydrosilyl group on the end of a molecule thereof, and cyclic polysiloxane compounds containing a hydrosilyl group can be used, and these compounds are not particularly limited by the structure thereof. Preferable are hydrosilyl group-containing polysiloxanes having a polyhedral structure in consideration of heat resistance, light resistance, chemical stability and the like. Compound (β) may be used as a single species or two or more species thereof may be used in combination.

Specific examples of the hydrosilyl group-containing polysiloxanes having a linear structure include copolymers of a dimethylsiloxane unit, a methylhydrogensiloxane unit and a terminal trimethylsiloxy unit, copolymers of a diphenylsiloxane unit, a methylhydrogensiloxane unit and a terminal trimethylsiloxy unit, copolymers of a methylphenylsiloxane unit, a methylhydrogensiloxane unit and a terminal trimethylsiloxy unit, and polysiloxanes in which an end thereof is blocked with a dimethylhydrogensilyl group.

Specific examples of the polysiloxanes having a hydrosilyl group on the end of a molecule thereof include the previously exemplified polysiloxanes in which an end thereof is blocked with a dimethylhydrogensilyl group, and polysiloxanes comprising a dimethylhydrogensiloxane unit ($H(CH_3)_2SiO_{1/2}$ unit) and at least one siloxane unit selected from the group consisting of $SiO_2$ unit, $SiO_{3/2}$ unit and $SiO$ unit.

Examples of the cyclic polysiloxane compounds containing a hydrosilyl group include 1,3,5,7-hydrogen-1,3,5,7-tetramethylcyclotetrasiloxane, 1-propyl-3,5,7-trihydrogen-1,3,5,7-tetramethylcyclotetrasiloxane, 1,5-dihydrogen-3,7-dihexyl-1,3,5,7-tetramethylcyclotetrasiloxane, 1,3,5-trihydrogen-1,3,5-trimethylcyclosiloxane, 1,3,5,7,9-pentahydrogen-1,3,5,7,9-pentamethylcyclosiloxane and 1,3,5,7,9,11-hexahydrogen-1,3,5,7,9,11-hexamethylcyclosiloxane.

The number of Si atoms contained in the polyhedral backbone of the hydrosilyl group-containing polysiloxane having a polyhedral structure is preferably 6 to 24, and a specific example thereof is a silsesquioxane having a polyhedral structure represented by the following structure (a typical example is shown here in which the number of Si atoms is 8).

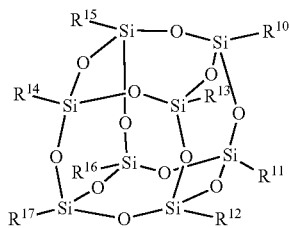

In the above formula, $R^{10}$ to $R^{17}$ represent non-substituted or substituted monovalent hydrocarbon groups, preferably having 1 to 20 carbon atoms and more preferably 1 to 10 carbon atoms and which may be the same or different, selected from alkenyl groups such as a vinyl group, allyl group, butenyl group or hexenyl group, organic groups containing a (meth) acryloyl group, epoxy group, mercapto group or amino group, a hydrogen atom, alkyl groups such as a methyl group, ethyl group, propyl group or butyl group, cycloalkyl groups such as a cyclohexyl group, aryl groups such as a phenyl group or tolyl group, or groups in which all or a portion of the hydrogen atoms bonded to carbon atoms of the foregoing groups are substituted with a halogen atom, cyano group or the like, such as a chloromethyl group, trifluoropropyl group or cyanoethyl group. However, at least one of $R^{10}$ to $R^{17}$ is a hydrosilyl group that is a reactive group of the hydrosilylation reaction.

The above-mentioned silsesquioxane having a polyhedral structure is obtained by, for example, a hydrolysis-condensation reaction of a silane compound represented by $RSiX_3$ (wherein, R represents the above-mentioned $R^{10}$ to $R^{17}$, and X represents a hydrolyzable functional group such as a halogen atom or alkoxy group). Alternatively, a method is known for synthesizing a silsesquioxane having a polyhedral backbone in which, after synthesizing a trisilanol compound that has three silanol groups in a molecule thereof by a hydrolysis-condensation reaction of $RSiX_3$, the trisilanol compound is reacted with the same or different trifunctional silane compound to form a closed ring.

A more preferable example of compound (β) is a silylated silicic acid having a polyhedral structure as represented by the structure indicated below (a typical example is shown here in which the number of Si atoms is 8). In this compound, since Si atoms that form a polyhedral backbone and reactive groups are bound together through siloxane bonds, the resulting cured product is not excessively rigid and a satisfactory cured product can be obtained.

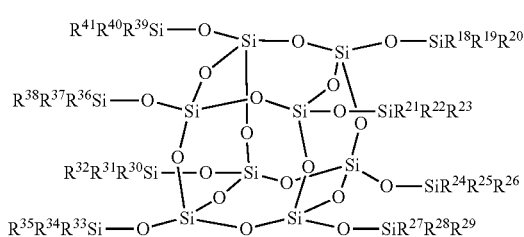

In the above structure, $R^{18}$ to $R^{41}$ represent the same or different organic groups selected from alkenyl groups such as a vinyl group, allyl group, butenyl group or hexenyl group, organic groups containing a (meth)acryloyl group, epoxy group, mercapto group or amino group, a hydrogen atom, alkyl groups such as a methyl group, ethyl group, propyl group or butyl group, cycloalkyl groups such as a cyclohexyl group, aryl groups such as a phenyl group or tolyl group, or groups in which all or a portion of the hydrogen atoms bonded to carbon atoms of the foregoing groups are substituted with a halogen atom, cyano group or the like, such as a chloromethyl group, trifluoropropyl group or cyanoethyl group. However, at least one of $R^{18}$ to $R^{41}$ is a hydrosilyl group that is a reactive group of the hydrosilylation reaction.

There are no particular limitations on the method used to synthesize a silicate having a polyhedral structure, and the silicate can be synthesized using a known method. A specific example of the synthesis method is a method in which a tetraalkoxysilane is hydrolyzed and condensed in the presence of a base such as quaternary ammonium hydroxide. Examples of the tetraalkoxysilane include tetraethoxysilane, tetramethoxysilane and tetrabutoxysilane. Examples of the quaternary ammonium hydroxide include 2-hydroxyethyl trimethyl ammonium hydroxide and tetramethyl ammonium hydroxide. In addition, in the present invention, a silicate having a similar polyhedral structure can also be obtained from silica or silica-containing materials such as rice husks instead of the tetraalkoxysilane.

In the present synthesis method, a silicate having a polyhedral structure can be obtained by a hydrolysis-condensation reaction of a tetraalkoxysilane. Subsequently, by further reacting the resulting silicate with a silylating agent such as a hydrosilyl group-containing silyl chloride, a polysiloxane can be obtained in which Si atoms that form a polyhedral structure and reactive groups in the form of hydrosilyl groups are bound together through siloxane bonds.

In the present invention, 6 to 24 Si atoms, and more preferably 6 to 10 Si atoms, can be preferably used as the number of Si atoms contained in the polyhedral backbone. A mixture of polysiloxanes that have polyhedral structures each containing different numbers of Si atoms may also be used.

In addition, in the present invention, the number of hydrosilyl groups contained in a molecule thereof is preferably at least two, and more preferably at least three. In the molecule, groups on Si atoms preferably comprise a hydrogen atom and a methyl group from the viewpoints of heat resistance and light resistance.

From the viewpoints of availability and good reactivity with compounds (α1), (α2) and (γ1), compound (β) is preferably a cyclic organopolysiloxane having at least three SiH groups in a molecule thereof, as represented by the following general formula (III):

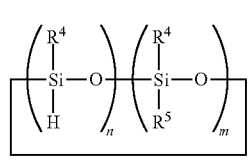

(III)

(wherein, $R^4$ and $R^5$ represent organic groups having 1 to 6 carbon atoms and may be the same or different, n represents a number of 1 to 10, and m represents a number of 0 to 10).

Examples of the above-mentioned organic groups include hydrocarbon groups (which may be partially substituted with oxygen). Methyl, ethyl, propyl, hexyl, octyl, decyl, dodecyl, cyclohexyl, norbornyl and phenyl groups are preferable, and from the viewpoint of availability, methyl, propyl, hexyl and phenyl groups are more preferable.

Substituents $R^4$ and $R^5$ in the compound represented by the general formula (III) are preferably composed of elements selected from the group consisting of C, H and O, are more preferably hydrocarbon groups, and are even more preferably methyl groups.

The compound represented by the general formula (III) is preferably 1,3,5,7-tetramethylcyclotetrasiloxane from the viewpoints of ease of availability and reactivity.

The above-mentioned compound (β) can be used as a single species or two or more species thereof can be used as a mixture.

(Compound (γ1))

There are no particular limitations on compound (γ1) provided it is a compound that has, in a molecule thereof, at least one photopolymerizable functional group and one or more carbon-carbon double bonds having reactivity with SiH groups. It is noted that the photopolymerizable functional group referred to here is the same as the photopolymerizable functional group possessed by the previously described polysiloxane compound, and the preferable aspects of the foregoing are similarly preferable here.

As the carbon-carbon double bonds having reactivity with SiH groups, the same carbon-carbon double bonds having reactivity with SiH groups as in the previously described compounds (α1) and (α2) are preferable.

Specific examples of compounds having an epoxy group as the photopolymerizable functional group include vinylcyclohexene oxide, allyl glycidyl ether, diallyl monoglycidyl isocyanurate and monoallyl diglycidyl isocyanurate, and from the viewpoint of superior photopolymerizability, vinylcyclohexene oxide which is a compound having an alicyclic epoxy group is particularly preferable.

Specific examples of compounds having a crosslinkable silicon group (hydrolyzable silyl group) as the polymerizable functional group include, but are not limited to, halogenated silanes such as trichlorovinylsilane, methyldichlorovinylsilane, dimethylchlorovinylsilane and phenyldichlorovinylsilane; alkoxysilanes such as trimethoxyvinylsilane, triethoxyvinylsilane, methyldiethoxyvinylsilane, methyldimethoxyvinylsilane and phenyldimethoxyvinylsilane; acyloxysilanes such as methyldiacetoxyvinylsilane and phenyldiacetoxyvinylsilane; and ketoximatesilanes such as bis(dimethylketoximate)methylvinylsilane and bis(cyclohexylketoximate)methylvinylsilane. Among these, alkoxysilanes can be used particularly preferably. In the case that the polymerizable functional group is a crosslinkable silicon group, the compound has the advantage of superior heat resistance.

In addition, from the viewpoint of availability, a compound represented by the following general formula (IV):

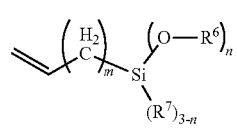

(IV)

(wherein, $R^6$ and $R^7$ each represent an organic group having 1 to 6 carbon atoms, n represents a number of 1 to 3 and m represents a number of 0 to 10) is preferable, and from the viewpoint of, for example, ease of removal of by-products following the reaction, trimethoxyvinylsilane, triethoxyvinylsilane, dimethoxymethylvinylsilane, diethoxymethylvinylsilane, methoxydimethylvinylsilane and ethoxydimethylvinylsilane are particularly preferable.

Examples of compounds having an acryloyl group or methacryloyl group as the photopolymerizable functional group include allyl(meth)acrylate, vinyl(meth)acrylate, dicyclopentenyl(meth)acrylate, dicyclopentenyloxyethyl (meth)acrylate, (meth)acrylate-modified allyl glycidyl ether (product name: Denacol Acrylate DA111, Nagase Chemtex) and a compound having one or more vinyl or allyl groups and one or more organic groups represented by the following formula (VI):

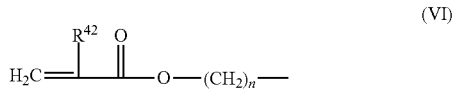

(wherein, n represents a number of 0 to 16 and $R^{42}$ represents a hydrogen atom or methyl group) within the same molecule, such as a compound of the above-mentioned general formula (II) in which at least one of $R^3$s is a group represented by the general formula (VI) above, and at least one of $R^3$s is a group such as a vinyl group or allyl group which has a carbon-carbon double bond having reactivity with SiH groups. From the viewpoint of high selectivity of hydrosilylation, preferable is a compound in which a methacryloyl group and an allyl or vinyl group are present together within the same molecule, and particularly in terms of availability, allyl(meth) acrylate and/or vinyl(meth)acrylate are preferable, and allyl methacrylate and vinyl methacrylate are particularly preferable.

Two or more species of compound (γ1) can be used in combination during the hydrosilylation reaction, regardless of the particular photopolymerizable functional groups.
(Compound (γ2))

There are no particular limitations on compound (γ2) provided it is a compound that has, in a molecule thereof, at least one photopolymerizable functional group and at least one SiH group that is a reactive group of the hydrosilylation reaction. Examples of the photopolymerizable functional group include the above-mentioned epoxy groups, cross-linkable silicon groups (hydrolyzable silyl groups) and acryloyl groups.

For example, a reaction product that is obtained by a hydrosilylation reaction between any of the above-mentioned compound (γ1) and a polyfunctional hydrosilane compound and that has at least one hydrosilyl group in a molecule thereof can be used. The polyfunctional hydrosilane compounds listed as examples for compound (α4) can similarly be used as the polyfunctional hydrosilane compound used here.

From the viewpoint of superior heat resistance of the cured product in particular, a compound having a hydrolyzable silyl group (crosslinkable silicon group) is preferable. Specific examples thereof include, but are not limited to, halogenated silanes such as trichlorosilane, methyldichlorosilane, dimethylchlorosilane and phenyldichlorosilane; alkoxysilanes such as trimethoxysilane, triethoxysilane, methyldiethoxysilane, methyldimethoxysilane and phenyldimethoxysilane; acyloxysilanes such as methyldiacetoxysilane and phenyldiacetoxysilane; and ketoximatesilanes such as bis(dimethylketoximate)methylsilane and bis(cyclohexylketoximate)methylsilane. Among these, alkoxysilanes can be used particularly preferably.
(Hydrosilylation Catalyst)

A known hydrosilylation catalyst may be used as a catalyst in the case of hydrosilylation of compounds (α1) to (α4), compound (β) and compounds (γ1) and (γ2).

From the viewpoint of catalytic activity, chloroplatinic acid, platinum-olefin complexes, platinum-vinylsiloxane complexes and the like are preferable. These catalysts may be used alone or two or more of these may be used in combination.

Although there are no particular limitations on the amount of catalyst added, in order to allow the hydrosilylation reaction to proceed smoothly, the preferable lower limit of the amount added is $10^{-8}$ moles and more preferably $10^{-6}$ moles relative to 1 mole of carbon-carbon double bonds having reactivity with SiH groups (which moiety may be simply referred to below as "the alkenyl groups"), charged upon the reaction, while the preferable upper limit of the amount added is $10^{-1}$ moles and more preferably $10^{-2}$ moles relative to 1 mole of the alkenyl groups of the above-mentioned compounds.

A co-catalyst can also be used in combination with the above-mentioned catalyst, and examples thereof include phosphorous compounds such as triphenylphosphine, 1,2-diester compounds such as dimethyl malate, acetylene alcohol compounds such as 2-hydroxy-2-methyl-1-butyne and 1-ethynyl-1-cyclohexanol, and sulfur compounds such as elemental sulfur. Although there are no particular limitations on the amount of co-catalyst added, the preferable lower limit of the amount added is $10^{-2}$ moles and more preferably $10^{-1}$ moles relative to 1 mol of hydrosilylation catalyst, while the preferable upper limit of the amount added is $10^2$ moles and more preferably 10 moles.
(Hydrosilylation Reaction Method)

Although there are various examples of the order and method of the reaction, from the viewpoint of simplifying the synthesis step, a method in which all compounds are made to undergo a hydrosilylation reaction in a one-pot approach followed finally by removing unreacted compounds is preferable.

From the viewpoint of reducing the likelihood of containing low molecular weight substances, a more preferable method consists of carrying out a hydrosilylation reaction on an excess of alkenyl group-containing compound (compound (α1), (α2), (α3)) and an SiH group-containing compound (compound (β), (α4)), or on an excess of SiH group-containing compound (compound (β), (α3)) and an alkenyl group-containing compound (compound (α1), (α2)), removing unreacted compounds, and then carrying out a hydrosilylation reaction on the resulting reaction product and compound (γ1) or compound (γ2).

Although there are no particular limitations on the reaction ratio of compounds, in the case of defining the total amount of alkenyl groups of compounds to be reacted as A, and defining the total amount of SiH groups of compounds to be reacted as B, then the ratio of B to A is preferably such that 1≤B/A≤30 and more preferably 1≤B/A≤10. In the case of 1>B/A, unreacted alkenyl groups remain in the composition, causing coloring, while in the case of 30<B/A, a large number of unreacted SiH groups remain, which may cause bubbling or cracking during curing of the composition.

Although various temperatures can be set for the reaction temperature, the lower limit of the temperature range in this case is preferably 30° C. and more preferably 50° C., while the upper limit of the temperature range is preferably 200° C. and more preferably 150° C. If the reaction temperature is excessively low, the reaction time for adequately carrying out the reaction becomes long, while if the reaction temperature is excessively high, the reaction is not practical. Although the reaction may be carried out at a constant temperature, the temperature may be changed in a stepwise manner or continuously as necessary.

The reaction time and the pressure during the reaction can be set to various parameters as necessary. Oxygen may be used during the hydrosilylation reaction. Adding oxygen to the gas phase in the reaction vessel makes it possible to accelerate the hydrosilylation reaction. From the viewpoint of making the amount of oxygen added to be lower than the lower explosion limit, the volumetric oxygen concentration of the gas phase must be controlled to 3% or less. From the viewpoint of realizing the effect of accelerating the hydrosilylation reaction by adding oxygen, the volumetric oxygen concentration of the gas phase is preferably 0.1% or more and more preferably 1% or more.

A solvent may be used upon the hydrosilylation reaction. There are no particular limitations on solvents able to be used provided they do not inhibit the hydrosilylation reaction, and specific examples of solvents that can be used preferably include hydrocarbon solvents such as benzene, toluene, hexane and heptane, ether solvents such as tetrahydrofuran, 1,4-dioxane, 1,3-dioxolane and diethyl ether, ketone solvents such as acetone and methyl ethyl ketone, and halogenated solvents such as chloroform, methylene chloride and 1,2-dichloroethane. A mixed solvent of two or more species of solvents can also be used for the solvent. Toluene, tetrahydrofuran, 1,3-dioxolane and chloroform are preferable as solvents. The amount of solvent used can be suitably set.

Various additives can be used according to the objective in the above-mentioned production method of the polysiloxane compound of the present invention.

(Gelling Inhibitor)

A gelling inhibitor can be used for the purpose of improving storage stability of the resulting reaction product, or for the purpose of inhibiting degeneration such as thickening caused by the heat treatment in the case of removing solvents and/or unreacted compounds by reduced-pressure volatilization after having carried out a hydrosilylation reaction between compound (α1) (and additionally compound (α2) depending on the aspect), compound (β1) or (β2), and compound (γ1). Known gelling inhibitors can be used as the gelling inhibitor, such as compounds containing an aliphatic unsaturated bond, organic phosphorous compounds, organic sulfur compounds, nitrogen-containing compounds, tin compounds and organic peroxides, and these may also be used in combination.

From the viewpoints of favorable delaying activity and availability of raw materials, benzothiazole, thiazole, dimethyl malate, 3-hydroxy-3-methyl-1-butyne, 1-ethynyl-1-cyclohexanol and triphenylphosphine are preferable.

Although the amount of gelling inhibitor added can be set to various amounts, the lower limit of the amount added is preferably $10^{-1}$ moles and more preferably 1 mole relative to 1 mole of hydrosilylation catalyst used, while the upper limit of the amount added is preferably $10^3$ moles and more preferably $10^2$ moles. If the amount added is excessively low, desired storage stability and gelling inhibitory effects during reduced-pressure volatilization are not obtained. If the amount added is excessively high, the gelling inhibitor can function as a curing inhibitor during the curing reaction.

The gelling inhibitor may be used as a single species or two or more species thereof may be used in combination.

(Curable Composition)

The curable composition of the present invention is characterized by containing a polysiloxane compound as previously described which has at least one photopolymerizable functional group in a molecule thereof, and has at least one member selected from the group consisting of structures represented by the following formulas (X1) to (X3), a phenolic hydroxyl group and a carboxyl group within the same molecule. As a result, the curable composition of the present invention has alkali developability and can yield a cured product having superior heat-resistant transparency.

In the curable composition of the present invention, a crosslinking agent having two or more photopolymerizable functional groups in a molecule thereof can be added in order to adjust workability, reactivity, adhesion and cured product strength. The compound to be added can be selected according to the type of curing reaction and can be used without any particular limitations. Compounds having a polymerizable group, such as epoxy compounds, oxetane compounds, alkoxysilane compounds and (meth)acrylate compounds, are used.

Specific examples of the epoxy compounds and oxetane compounds include phenol novolak-type epoxy resins, biphenyl-type epoxy resins, dicyclopentadiene-type epoxy resins, cyclohexylepoxy group-containing polyorganosiloxanes (cyclic, linear), glycidyl group-containing polyorganosiloxanes (cyclic, linear), bisphenol F diglycidyl ether, bisphenol A diglycidyl ether, 2,2'-bis(4-glycidyloxycyclohexyl)propane, 3,4-epoxycyclohexylmethyl-3,4-epoxycyclohexane carboxylate, vinylcyclohexene dioxide, 2-(3,4-epoxycyclohexyl)-5,5-spiro-(3,4-epoxycyclohexane)-1,3-dioxane, bis(3,4-epoxycyclohexyl)adipate, 1,2-cyclopropanedicarboxylic acid bisglycidyl ester, triglycidyl isocyanurate, monoallyl diglycidyl isocyanurate, diallyl monoglycidyl isocyanurate, 1,4-bis{(3-ethyl-3-oxetanyl)methoxy}methyl}benzene, bis{1-ethyl(3-oxetanyl)}methyl ether, 3-ethyl-3-(phenoxymethyl)oxetane, and 3-ethyl-3-(2-ethylhexyloxymethyl)oxetane.

Specific examples of the alkoxysilane compounds include tetramethoxy(ethoxy)silane and condensation products thereof, methyltrimethoxy(ethoxy)silane and condensation products thereof, and dimethyldimethoxy(ethoxy)silane and condensation products thereof.

Specific examples of the (meth)acrylate compounds include allyl(meth)acrylate, vinyl(meth)acrylate, dicyclopentenyl(meth)acrylate, dicyclopentenyloxyethyl (meth)acrylate, (meth)acrylate-modified allyl glycidyl ether (product name: Denacol Acrylate DA111, Nagase Chemtex), urethane (meth)acrylates, epoxy(meth)acrylates, trimethylolpropane tri(meth)acrylate, pentaerythritol tetra(meth)acrylate, ditrimethylolpropane tetra(meth)acrylate, dipentaerythritol hexa(meth)acrylate, butanediol di(meth)acrylate, nonanediol di(meth)acrylate, polypropylene glycol-based (meth)acrylates, bisphenol A di(meth)acrylate, tris(2-(meth)acryloyloxyethyl)isocyanurate and (meth)acrylate group-containing polyorganosiloxanes.

Although various amounts can be set for the amount of reactive diluent added, the amount added is preferably 1 to 50 parts by weight and more preferably 3 to 25 parts by weight relative to 100 parts by weight of the polysiloxane compound. If the amount added is excessively low, the effects of addition are not manifested, while if the amount added is excessively high, the reactive diluent may have a detrimental effect on the physical properties of the cured product.

In addition, a polymerization initiator or photoacid generator may be suitably selected and used in the curable composition of the present invention, according to the particular photopolymerizable functional group.

The following provides an explanation of a cationic polymerization initiator, a radical polymerization initiator and a photoacid generator.

(Cationic Polymerization Initiator)

There are no particular limitations on the cationic polymerization initiator provided it is an active energy beam cationic polymerization initiator, which generates a cationic species or Lewis acid due to an active energy beam, or a thermal cationic polymerization initiator, which generates a cationic species or Lewis acid due to heat.

The active energy beam cationic polymerization initiator include one or more types of: metal-fluoroboron complex salts and boron trifluoride complex compounds as described in U.S. Pat. No. 3,379,653; bis(perfluoroalkylsulfonyl)methane metal salts as described in U.S. Pat. No. 3,586,616; aryl diazonium compounds as described in U.S. Pat. No. 3,708,296; aromatic onium salts of group VIa elements as described in U.S. Pat. No. 4,058,400; aromatic onium salts of group Va elements as described in U.S. Pat. No. 4,069,055; dicarbonyl chelates of group IIIa to group Va elements as described in U.S. Pat. No. 4,068,091; thiopyrylium salts as described in U.S. Pat. No. 4,139,655; group VIa elements in the form of $MF_6^-$ anions (wherein, M is selected from phosphorous, antimony and arsenic) as described in U.S. Pat. No. 4,161,478; aryl sulfonium complex salts as described in U.S. Pat. No. 4,231,951; aromatic iodonium complex salts and aromatic sulfonium complex salts as described in U.S. Pat. No. 4,256,828; bis[4-(diphenylsulfonio)phenyl]sulfide-bishexafluoro metal salts (such as phosphates, arsenates and antimonates) as described by W. R. Watt et al. in "Journal of Polymer Science—Polymer Chemistry Edition", Vol. 22, p. 1789 (1984); and aromatic iodonium complex salts and aromatic sulfonium complex salts in which the anion is B $(C_6F_5)_4^-$.

Preferable examples of cation-type active energy beam cationic polymerization initiators include aryl sulfonium complex salts, aromatic sulfonium or iodonium salts of halogen-containing complex ions, and aromatic onium salts of group II, V and VI elements. Several of these salts are available as commercial products of FX-512 (3M), UVR-6990 and UVR-6974 (Union Carbide), UVE-1014 and UVE-1016 (General Electric), KI-85 (Degussa), SP-152 and SP-172 (Asahi Denka), San-Aid SI-60L, SI-80L and SI-100L (Sanshin Chemical Industry), WPI113 and WPI116 (Wako Pure Chemical Industries) and Rhodorsil PI2074 (Rhodia).

As the thermal cationic polymerization initiator, cation or protonic acid catalysts, such as sulfonium salts, ammonium salts, pyridinium salts, phosphonium salts, iodonium salts, triflic acid salts, boron trifluoride ether complex compounds and boron trifluoride, can be used. These can be said to be latent curing catalysts since they have high stability until cationic species are generated by heating. Polymerization activity varies according to the particular substituent and the particular anion of onium salt, and with respect to anions in particular, polymerization activity is known to increase in the order of $BF^-<AsF_6^-<PF_6^-<SbF_6^-<B(C_6F_5)_4^-$. In addition, it has been known that combinations of an aluminum complex and a silanol compound and combinations of an aluminum complex and a specific phenol compound such as bisphenol S may serve as cationic polymerization catalysts.

Some aromatic onium salts used as active energy beam cationic polymerization initiators generate cationic species due to heat, and these can also be used as thermal cationic polymerization initiators. Examples include San-Aid SI-60L, SI-80L and SI-100L (Sanshin Chemical Industry) and Rhodorsil PI2074 (Rhodia). Among the mentioned cationic polymerization initiators, aromatic onium salts are preferable in terms of superior balance between handling ease, latency and curability.

The amount of cationic polymerization initiator used is preferably 0.01 to 10 parts by weight and more preferably 0.1 to 5 parts by weight relative to 100 parts by weight of the compound having a photopolymerizable functional group. If the amount of the cationic polymerization initiator is excessively low, a long time is required for curing or an adequately cured product is not obtained. If the amount of the initiator is excessively high, the color of the initiator remains in the cured product, coloring or protrusions occur due to too rapid curing, or heat resistance and light resistance of the cured product are impaired, thereby resulting in undesirable effects.

(Radical Polymerization Initiator)

A radical polymerization initiator can be used without any particular limitations provided it is an active energy beam radical polymerization initiator, which generates radical species due to an active energy beam, or a thermal radical polymerization initiator, which generates radical species due to heat.

Examples of the active energy beam radical polymerization initiator include acetophenone compounds, benzophenone compounds, acylphosphine oxide compounds, oxime ester compounds, benzoin compounds, biimidazole compounds, α-diketone compounds, titanocene compounds, polynuclear quinone compounds, xanthone compounds, thioxanthone compounds, triazine compounds, ketal compounds, azo compounds, peroxides, 2,3-dialkyldione compounds, disulfide compounds, thiuram compounds and fluoroamine compounds. Specific examples of the acetophenone compounds include 1-(4-dodecylphenyl)-2-hydroxy-2-methylpropan-1-one, 2,2-dimethoxy-2-phenylacetophenone, 2-hydroxy-2-methyl-1-phenylpropan-1-one, 1-(4'-1-propylphenyl)-2-hydroxy-2-methylpropan-1-one, 4-(2'-hydroxyethoxy)phenyl(2-hydroxy-2-propyl)ketone, 2,2-dimethoxyacetophenone, 2,2-diethoxyacetophenone, 2-methyl-1-(4'-methylthiophenyl)-2-morpholinopropan-1-one, 2-benzyl-2-dimethylamino-1-(4'-morpholinophenyl)butan-1-one, 1-hydroxycyclohexyl phenyl ketone, 2,2-dimethoxy-1,2-diphenylethan-1-one, and 2-hydroxy-1-{4-[4-(2-hydroxy-2-methyl-propionyl)-benzyl]phenyl]-2-methyl-propane-1-one. Specific examples of the acylphosphine oxide compounds include 2,4,6-trimethylbenzoyl-diphenylphosphine oxide and bis(2,4,6-trimethylbenzoyl)-phenylphosphine oxide. Specific examples of the oxime ester compounds include 1,2-octanedione 1-[4-(phenylthio)-2-(O-benzoyloxime)] and ethanone 1-[9-ethyl-6-(2-methylbenzoyl)-9H-carbazol-3-yl]-1-(O-acety loxime). Specific examples of the benzoin compounds include benzoin, benzoin methyl ether, benzoin ethyl ether, benzoin isopropyl ether, benzoin isobutyl ether and methyl 2-benzoylbenzoate. Specific examples of the benzophenone compounds include benzyl dimethyl ketone, benzophenone, 4,4'-bis(dimethylamino)benzophenone and 4,4'-bis(diethylamino)benzophenone. Specific examples of the α-diketone compounds include diacetyl, dibenzoyl and methylbenzoyl formate. Specific examples of the biimidazole compounds include 2,2'-bis(2-chlorophenyl)-4,4',5,5'-tetrakis(4-ethoxycarbony 1-phenyl)-1,2'-biimidazole, 2,2'-bis(2,4-dichlorophenyl)-4,4'5,5'-tetrakis(4-ethoxycarbonylphenyl)-1,2'-biimidazole, 2,2'-bis(2,4,6-trichlorophenyl)-4,4',5,5'-tetrakis(4-ethoxy carbonylphenyl)-1,2'-biimidazole, 2,2'-bis(2-bromophenyl)-4,4',5,5'-tetrakis(4-ethoxycarbonyl phenyl)-1,2'-biimidazole, 2,2'-bis(2,4-dibromophenyl)-4,4',5,5'-tetrakis(4-ethoxycarbonylphenyl)-1,2'-biimidazole, 2,2'-bis(2,4,6-tribromophenyl)-4,4',5,5'-tetrakis(4-ethoxycarbonylphenyl)-1,2'-biimidazole, 2,2'-bis(2-chlorophenyl)-4,4',5,5'-tetraphenyl-1,2'-biimidazole, 2,2'- bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-b iimidazole. Specific examples of the polynuclear quinone compounds include anthraquinone, 2-ethylanthraquinone, 2-t-butylanthraquinone and 1,4-naphthoquinone. Specific examples of the xanthone compounds include xanthone, thioxanthone, 2-chlorothioxanthone and 2,5-diethyldioxanthone. Specific examples of the triazine compounds include 1,3,5-tris(trichloromethyl)-s-triazine, 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'-methoxyphenyl)-s-triazine, 2-(2'-furylethylidene)-4,6-bis(trichloromethyl)-s-triazine, 2-(4'-methoxystyryl)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, and 2-(2'-thiophenylethylidene)-4,6-bis(trichloromethyl)-s-triazine.

From the viewpoint of superior thin film curability in particular, 2,4,6-trimethylbenzoyl-diphenylphosphine oxide, bis(2,4,6-trimethylbenzoyl)-phenylphosphine oxide, 2-hydroxy-1-{4-[4-(2-hydroxy-2-methyl-propionyl)-benzyl]phenyl}-2-methyl-propane-1-one, 1,2-octanedione 1-[4-(phenylthio)-2-(O-benzoyloxime)] and ethanone 1-[9-ethyl-6-(2-methylbenzoyl)-9H-carbazol-3-yl]-1-(O-acetyloxime) are preferable.

From the viewpoint of the cured product having superior transparency in particular, 1-hydroxycyclohexyl phenyl ketone, 2,2-dimethoxy-2-phenylacetophenone, 2-hydroxy-2-methyl-1-phenylpropan-1-one, 1-(4'-1-propylphenyl)-2-hydroxy-2-methylpropan-1-one, 4-(2'-hydroxyethoxy)phenyl(2-hydroxy-2-propyl)ketone and 2,2-dimethoxyacetophenone are preferable.

Specific examples of the thermal radical polymerization initiator include diacyl peroxides such as acetyl peroxide and benzoyl peroxide, ketone peroxides such as methyl ethyl ketone peroxide and cyclohexanone peroxide, hydroperoxides such as hydrogen peroxide, tert-butyl hydroperoxide and cumene hydroperoxide, dialkyl peroxides such as di-tert-butyl peroxide, dicumyl peroxide and dilauroyl peroxide, peroxy esters such as tert-butyl peroxyacetate and tert-butyl peroxypivalate, azo compounds such as azobisisobutyronitrile and azobisisovaleronitrile, and persulfates such as ammonium persulfate, sodium persulfate and potassium persulfate.

These radical polymerization initiators may be used alone or two or more of these may be used in combination.

The amount of radical polymerization initiator used is preferably 0.1 to 15 parts by weight and more preferably 0.1 to 10 parts by weight relative to 100 parts by weight of the compound having a photopolymerizable functional group. If the amount of radical polymerization initiator is excessively low, curing is inadequate and contrast tends to be unable to be obtained upon development with alkali. If the amount of the initiator is excessively high, the cured film itself becomes colored, thereby making this undesirable.

(Photoacid Generator)

There are no particular limitations on the photoacid generator able to be used in the curable composition of the present invention provided it is a compound that can release an acidic active substance that is able to crosslink crosslinkable silyl groups, by radiation of an active energy beam such as visible light, ultraviolet rays, infrared rays, X-rays, α-rays, β-rays, γ-rays or i-rays.

Although there are no particular limitations on the pKa of the acid generated by the photoacid generator, it is preferably less than 3 and more preferably less than 1.

Known photoacid generators can be used as the photoacid generator able to be used in the curable composition of the present invention. Examples of the photoacid generator include, but are not particularly limited to, various kinds of compounds indicated as being preferable in Japanese Patent Application Laid-open No. 2000-1648, Japanese Translation of PCT Application No. 2001-515533 and WO 2002-83764. Preferable examples of the photoacid generator able to used in the present invention include sulfonate esters, carboxylic acid esters and onium salts, and onium salts are more preferable.

In the present invention, various sulfonic acid derivatives can be used as photoacid generators in the form of the sulfonate esters. Examples include disulfones, disulfonyldiazomethanes, disulfonylmethanes, sulfonylbenzoylmethanes, imidosulfonates such as trifluoromethyl sulfonate derivatives, benzoin sulfonates, sulfonates of 1-oxo-2-hydroxy-3-propyl alcohol, pyrogallol trisulfonates and benzyl sulfonates.

Specific examples of the sulfonate ester photoacid generators include diphenyldisulfone, ditosyldisulfone, bis(phenylsulfonyl)diazomethane, bis(chlorophenylsulfonyl)diazomethane, bis(xylylsulfonyl)diazomethane, phenylsulfonylbenzoyldiazomethane, bis(cyclohexylsulfonyl)methane, 1,8-naphthalenedicarboxylic acid imidomethylsulfonate, 1,8-naphthalenedicarboxylic acid imidotosylsulfonate, 1,8-naphthalenedicarboxylic acid imidotrifluoromethylsulfonate, 1,8-naphthalenedicarboxylic acid imidocamphorsulfonate, succinic acid imidophenylsulfonate, succinic acid imidotosylsulfonate, succinic acid imidotrifluoromethylsulfonate, succinic acid imidocamphorsulfonate, phthalic acid imidotrifluorosulfonate, cis-5-norbornene-endo-2,3-dicarboxylic acid imidotrifluoromethylsulfonate, benzoin tosylate, 1,2-diphenyl-2-hydroxypropyl tosylate, 1,2-di(4-methylmercaptophenyl)-2-hydroxypropyl tosylate, pyrogallol methylsulfonate, pyrogallol ethylsulfonate, 2,6-dinitrophenylmethyl tosylate, ortho-nitrophenylmethyl tosylate, and para-nitrophenyl tosylate.

These can be used alone or two or more of these can be used in combination. Carboxylic acid esters can also be used similarly in the present invention.

In general, sulfonic acid esters and carboxylic acid esters may require a heating step (50 to 100° C.) to release the acid.

Examples of the onium salts that can be used in the present invention include sulfonium salts or iodonium salts having an anion such as tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($sbCl_6^-$), tetraphenylborate, tetrakis(trifluoromethylphenyl)borate, tetrakis(pentafluoromethylphenyl)borate, perchlorate ion ($ClO_4^-$), trifluoromethanesulfonate ion ($CF_3SO_3^-$), fluorosulfonate ion ($FSO_3^-$), toluenesulfonate ion, trinitrobenzenesulfonate anion, or trinitrotoluenesulfonate anion.

Examples of the sulfonium salts include triphenylsulfonium hexafluoroacylnate, triphenylsulfonium hexafluoroborate, triphenylsulfonium tetrafluoroborate, triphenylsulfonium tetrakis(pentafluorobenzyl)borate, methyldiphenylsulfonium tetrafluoroborate, methyldiphenylsulfonium tetrakis(pentafluorobenzyl)borate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-butoxyphenyldiphenylsulfonium tetrakis(pentafluorobenzyl)borate, 4-chlorophenyldiphenylsulfonium hexafluoroantimonate, tris(4-phenoxyphenyl)sulfonium hexafluorophosphate, di(4-ethoxyphenyl)methylsulfonium hexafluoroarsenate, 4-acetylphenyldiphenylsulfonium tetrafluoroborate, 4-acetylphenyldiphenylsulfonium tetrakis(pentafluorobenzyl)borate, tris(4-thiomethoxyphenyl)sulfonium hexafluorophosphate, di(methoxysulfonylphenyl)methylsulfonium hexafluoroantimonate, di(methoxynaphthyl)methylsulfonium tetrafluoroborate, di(methoxynaphthyl)methylsulfonium tetrakis(pentafluorobenzyl)borate, di(carbomethoxyphenyl)methylsulfonium hexafluorophosphate, (4-octyloxyphenyl)diphenylsulfonium tetrakis(3,5-bis-trifluoromethylphenyl)borate, tris(dodecylphenyl)sulfonium tetrakis(3,5-bis-trifluoromethylphenyl)borate, 4-acetamidophenyldiphenylsulfonium tetrafluoroborate, 4-acetamidophenyldiphenylsulfonium tetrakis(pentafluorobenzyl)borate, dimethylnaphthylsulfonium hexafluorophosphate, trifluoromethyldiphenylsulfonium tetrafluoroborate, trifluoromethyldiphenylsulfonium tetrakis(pentafluorobenzyl)borate, phenylmethylbenzylsulfonium hexafluorophosphate, 10-methylphenoxathiinium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)borate, 5-methyl-10-oxothianthrenium tetrafluoroborate, 5-methyl-10-oxothianthrenium tetrakis(pentafluorobenzyl)borate, and 5-methyl-10,10-dioxothianthrenium hexafluorophosphate. These can be used alone or two or more of these can be used in combination.

Examples of the iodonium salts able to be used in the present invention include (4-n-decyloxyphenyl)phenyliodonium hexafluoroantimonate, [4-(2-hydroxy-n-tetradecyloxy)phenyl]phenyliodonium hexafluoroantimonate, [4-(2-hydroxy-n-tetradecyloxy)phenyl]phenyliodonium trifluorosulfonate, [4-(2-hydroxy-n-tetradecyloxy)phenyl]phenyliodonium hexafluorophosphate, [4-(2-hydroxy-n-tetradecyloxy)phenyl]phenyliodonium tetrakis(pentafluorophenyl)borate, bis(4-t-butylphenyl)iodonium hexafluoroantimonate, bis(4-t-butylphenyl)iodonium hexafluorophosphate, bis(4-t-butylphenyl)iodonium trifluorosulfonate, bis(4-t-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulfonate, di(dodecylphenyl)iodonium hexafluoroantimonate, di(dodecylphenyl)iodonium triflate, diphenyliodonium bisulfate, 4,4'-dichlorodiphenyliodonium bisulfate, 4,4'-dibromodiphenyliodonium bisulfate, 3,3'-dinitrodiphenyliodonium bisulfate, 4,4'-dimethyldiphenyliodonium bisulfate, 4,4'-bissuccinimidediphenyliodonium bisulfate, 3-nitrodiphenyliodonium bisulfate, 4,4'-dimethoxydiphenyliodonium bisulfate, bis(dodecylphenyl)iodonium tetrakis(pentafluorophenyl)borate, (4-octyloxyphenyl)phenyliodonium tetrakis(3,5-bis-trifluoromethylphenyl)borate, (tolylcumyl)iodonium tetrakis(pentafluorophenyl)borate $(CH_3C_6H_4)_2I$-$(SO_2CF_3)_3$, which is disclosed in U.S. Pat. No. 5,554,664, $(C_6H_5)_2I$-$B(C_6F_5)_4$, which is disclosed in U.S. Pat. No. 5,514,728, and that disclosed in U.S. Pat. No. 5,340,898. These can be used alone or two or more of these can be used in combination.

Aromatic diazonium salts can also be used as the onium salts, and for example, p-methoxybenzenediazonium hexafluoroantimonate can be used.

Examples of the commercially available onium salts that can be used in the present invention include: San-Aid SI-60, SI-80, SI-100, SI-60L, SI-80L, SI-100L, SI-L145, SI-L150, SI-L160, SI-L110 and SI-L147 (from Sanshin Chemical Industry), UVI-6950, UVI-6970, UVI-6974 and UVI-6990 (from Union Carbide), Adeka Optomer SP-150, SP-151, SP-170, SP-171 and SP-172 (from Asahi Denka), Irgacure 261 (from Ciba Specialty Chemicals), CI-2481, CI-2624, CI-2639 and CI-2064 (from Nippon Soda), CD-1010, CD-1011 and CD-1012 (from Sartomer), DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (from Midori Kagaku), PCI-061T, PCI-062T, PCI-020T and PCI-022T (from Nippon Kayaku), IBPF and IBCF (from Sanwa Chemical), CD1012 (from Sartomer), IBPF and IBCF (from Sanwa Chemical), BBI-101, BBI-102, BBI-103 and BBI-109 (from Midori Kagaku), UVE1014 (from General Electric), and Rhodorsil PI2074 (from Rhodia).

In addition, diaryliodonium salts that can be produced by methods described in J. Polymer Science: Part A: Polymer Chemistry, Vol. 31, 1473-1482 (1993) and J. Polymer Science: Part A: Polymer Chemistry, Vol. 31, 1483-1491 (1993) can also be used.

Although there are no particular limitations on the content of photoacid generator in the curable composition of the present invention, from the viewpoint of curability, it is preferably 0.01 to 10 parts by weight relative to 100 parts by weight of the compound having a photopolymerizable functional group, and from the viewpoint of balanced physical properties of the cured product, it is more preferably 0.1 to 5.0 parts by weight. If the amount of photoacid generator is excessively low, a long time is required for curing or an adequate cured product is not obtained. If the amount of photoacid generator is excessively high, its color remains in the cured product, coloring occurs due to too rapid curing, or heat resistance and light resistance are impaired, thereby resulting in undesirable effects.

(Sensitizer)

In the curable composition of the present invention, a sensitizer may be appropriately added in order to improve photosensitivity and impart sensitivity to high wavelength light such as g rays (436 nm), h rays (405 nm) or i rays (365 nm) in the case of curing with light energy. Such a sensitizer can be used in combination with the above-mentioned cationic polymerization initiator, radical polymerization initiator and photoacid generator to adjust curability.

Examples of the compound to be added include anthracene compounds and thioxanthone compounds.

Specific examples of the anthracene compounds include anthracene, 2-ethyl-9,10-dimethoxyanthracene, 9,10-dimethylanthracene, 9,10-dibutoxyanthracene, 9,10-dipropoxyanthracene, 9,10-diethoxyanthracene, 1,4-dimethoxyanthracene, 9-methylanthracene, 2-ethylanthracene, 2-tert-butylanthracene, 2,6-di-tert-butylanthracene, and 9,10-diphenyl-2,6-di-tert-butylanthracene. From the viewpoint of ease of availability in particular, anthracene, 9,10-dimethylanthracene, 9,10-dibutoxyanthracene, 9,10-dipropoxyanthracene, 9,10-diethoxyanthracene and the like are preferable.

Anthracene is preferable from the viewpoint of superior transparency of the cured product, while 9,10-dibutoxyanthracene, 9,10-dipropoxyanthracene, 9,10-diethoxyanthracene and the like are preferable from the viewpoint of superior compatibility with the curable composition.

Specific examples of the thioxanthone compounds include thioxanthone, 2-chlorothioxanthone and 2,5-diethyldioxanthone The mentioned sensitizers may be used alone or two or more thereof may be used in combination.

Although there are no particular limitations on the content of the sensitizer in the curable composition of the present invention provided it is able to demonstrate sensitizing effects, the amount of sensitizer added is preferably 0.01 to 300 moles and more preferably 0.1 to 100 moles relative to 1 mole of the added initiator (cationic polymerization initiator, radical polymerization initiator or photoacid generator). If the amount of sensitizer is excessively low, sensitizing effects are not obtained and a long time is required for curing or there may be undesirable effects on developability, while on the other hand, if the amount of sensitizer is excessively high, its color may remain in the cured product or there may be the risk of coloring due to too rapid curing or impaired heat resistance and light resistance.

(Reactive Modifier)

When using the curable composition of the present invention as a radical curing system, thiol compounds, amine compounds, phosphine compounds and the like can be added to modify reactivity and suppress the inhibition of curing by oxygen.

Specific examples of the thiol compounds include tri[(3-mercaptopropionyloxy)-ethyl]isocyanurate, trimethylolpropane tris-3-mercaptopropionate, pentaerythritol tetrakis-3-mercaptopropionate, dipentaerythritol-3-mercaptopropionate, 1,4-bis(3-mercaptobutyryloxy)butane, pentaerythritol tetrakis(3-mercaptobutyrate), 1,3,5-tris(3-mercaptobutyloxyethyl)-1,3,5-triazine-2,4,6 trione and mercapto group-containing polyorganosiloxanes (such as KF2001 and KF2004, Shin-Etsu Chemical).

From the viewpoint of superior heat resistance, 3,5-tris (3-mercaptobutyloxyethyl)-1,3,5-triazine-2,4,6 trione, tri[(3-mercaptopropionyloxy)-ethyl]isocyanurate and mercapto group-containing polyorganosiloxanes (such as KF2001 and KF2004, Shin-Etsu Chemical) are particularly preferable.

Specific examples of the phosphine compounds include triphenylphosphine and tributylphosphine.

(Adhesion Promoter)

An adhesion promoter can also be added in the curable composition of the present invention. Examples of the adhesion promoter not only include commonly used adhesives but also, for example, various coupling agents, epoxy compounds, oxetane compounds, phenol resins, coumarone-indene resins, rosin ester resins, terpene-phenol resins, α-methylstyrene-vinyltoluene copolymers, polyethylmethylstyrene and aromatic polyisocyanates.

Examples of the coupling agents include silane coupling agents. There are no particular limitations on the silane coupling agents provided they have at least one functional group having reactivity with an organic group and at least one hydrolyzable silicon group in a molecule thereof. As the group having reactivity with an organic group, at least one functional group selected from an epoxy group, methacrylic group, acrylic group, isocyanate group, isocyanurate group, vinyl group and carbamate group is preferable from the viewpoint of handling ease, and an epoxy group, methacrylic group or acrylic group is particularly preferable from the viewpoints of curability and adhesion. The hydrolyzable silicon group is preferably an alkoxysilyl group from the viewpoint of handling ease, and particularly preferably a methoxysilyl group or ethoxysilyl group from the viewpoint of reactivity.

Preferable examples of the silane coupling agents include alkoxysilanes having an epoxy functional group such as 3-glycidoxypropyltrimethoxysilane, 3-glycidoxypropyltriethoxysilane, 2-(3,4-epoxycyclohexyl)ethyltrimethoxysilane and 2,(3,4-epoxycyclohexyl)ethyltriethoxysilane; and alkoxysilanes having a methacrylic group or acrylic group such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

Although various amounts can be set for the amount of the silane coupling agent added, it is preferably 0.1 to 20 parts by weight, more preferably 0.3 to 10 parts by weight and even more preferably 0.5 to 5 parts by weight relative to 100 parts by weight of the compound having a photopolymerizable functional group. If the amount added is excessively low, adhesion-promoting effects are not manifested, while if the amount added is excessively high, there may be detrimental effects on curability and the physical properties of the cured product.

These coupling agents, silane coupling agents, epoxy compounds and the like may be used alone or two or more of these may be used in combination.

A carboxylic acid and/or acid anhydride can be used in the present invention to enhance the effects of the coupling agent or epoxy compound, thereby making it possible to improve and/or stabilize adhesion. Although there are no particular limitations on such carboxylic acids or acid anhydrides, examples include 2-ethylhexanoic acid, cyclohexanecarboxylic acid, cyclohexanedicarboxylic acid, methylcyclohexanedicarboxylic acid, tetrahydrophthalic acid, methyltetrahydrophthalic acid, methylhimic acid, norbornenedicarboxylic acid, hydrogenated methylnadic acid, maleic acid, acetylenedicarboxylic acid, lactic acid, malic acid, citric acid, tartaric acid, benzoic acid, hydroxybenzoic acid, cinnamic acid, phthalic acid, trimellitic acid, pyromellitic acid, naphthalenecarboxylic acid, naphthalenedicarboxylic acid, and anhydrides of these individual acids or mixtures of these acids.

Among these carboxylic acids and/or acid anhydrides, from the viewpoint of causing less impairment of physical properties of the resulting cured product, examples of preferable carboxylic acids and/or acid anhydrides include tetrahydrophthalic acid, methyltetrahydrophthalic acid and anhydrides of these individual acids or mixtures of these acids.

Although various amounts can be set for the amount of carboxylic acid and/or acid anhydride used, the added amount is preferably in the range of 0.1 to 50 parts by weight and more preferably 1 to 10 parts by weight relative to 100 parts by weight of the coupling agent and/or epoxy compound. If the amount added is excessively low, adhesion-promoting effects are not manifested, while if the amount added is excessively high, there may be detrimental effects on the physical properties of the cured product.

These carboxylic acids and/or acid anhydrides may be used alone or two or more of these may be used in combination.

(Phosphorous Compound)

In the case that the curable composition of the present invention is cured by light or heat and is used in an application requiring transparency in particular, a phosphorous compound is preferably used to improve hue after curing by light or heat. Specific examples of phosphorous compounds that are used preferably include antioxidants selected from phosphites such as triphenyl phosphite, diphenyl isodecyl phosphite, phenyl diisodecyl phosphite, tris (nonylphenyl)phosphite, diisodecyl pentaerythritol diphosphite, tris(2,4-di-t-butylphenyl)phosphite, cyclic neopentanetetraylbis(octadecylphosphite), cyclic neopentanetetraylbis(2,4-di-t-butylphenyl)phosphite, cyclic neopentanetetraylbis(2,6-di-t-butyl-4-methylphenyl)phosphite and bis[2-t-butyl-6-methyl-4-{2-(octadecyloxycarbonyl)ethyl}phenyl]hydrogen phosphite; or coloring prevention agents selected from oxaphosphaphenanthrene oxides such as 9,10-dihydro-9-oxa-10-phosphaphenanthrene-10-oxide, 10-(3,5-di-t-butyl-4-hydroxybenzyl)-9,10-dihydro-9-oxa-10-p hosphaphenanthrene-10-oxide and 10-decyloxy-9,10-dihydro-9-oxa-10-phosphaphenanthrene-10-ox ide.

The amount of the phosphorous compound used is preferably 0.01 to 10 parts by weight and more preferably 0.1 to 5 parts by weight relative to 100 parts by weight of the compound having a photopolymerizable functional group. If the amount of the phosphorous compound used is less than 0.01 parts by weight, the effect of improving hue is diminished. If the amount used exceeds 10 parts by weight, there may be detrimental effects on curability and the physical properties of the cured product.

(Thermoplastic Resin)

Various thermoplastic resins may be added in the composition for the purpose of improving properties of the composition. Various thermoplastic resins can be used, and examples include, but are not limited to, acrylic reins typically including polymethyl methacrylate resins such as homopolymers of methyl methacrylate or random, block or graft copolymers of methyl methacrylate and other monomers (for example, Optorez manufactured by Hitachi Chemical) and polybutyl acrylate resins such as homopolymers of butyl acrylate or random, block or graft copolymers of butyl acrylate and other monomers; polycarbonate resins such as polycarbonate resins having a monomer structure such as bisphenol A or 3,3,5-trimethylcyclohexylidene bisphenol (for example, APEC manufactured by Teij in); cycloolefin resins such as resins that are homopolymers or copolymers of norbornene derivatives or vinyl monomers, resins obtained by ring-opening metathesis polymerization of norbornene derivatives, or hydrogenation products thereof (for example, APEL manufactured by Mitsui Chemicals, ZEONOR and ZEONEX manufactured by Zeon Corporation, and ARTON manufactured by JSR); olefin-maleimide resins such as copolymers of ethylene and maleimide (for example, TI-PAS manufactured by Tosoh); polyester resins such as polyesters obtained by polycondensation of bisphenols such as bisphenol A or bis(4-(2-hydroxyethoxy)phenyl)fluorene or diols such as diethylene glycol and phthalic acids such as terephthalic acid or isophthalic acid or aliphatic dicarboxylic acids (for example, O-PET manufactured by Kanebo); polyethersulfone resins, polyarylate resins, polyvinylacetal resins, polyethylene resins, polypropylene resins, polystyrene resins, polyamide resins, silicone resins and fluorine resins, as well as rubber-like resins such as natural rubber or EPDM.

The thermoplastic resin may have a crosslinkable group. Examples of crosslinkable groups in this case include an epoxy group, amino group, radical-polymerizable unsaturated group, carboxyl group, isocyanate group, hydroxyl group and alkoxysilyl group. The thermoplastic resin preferably has an average of one or more crosslinkable groups in a molecule thereof from the viewpoint of greater heat resistance of the resulting cured product.

Although there are no particular limitations on the molecule weight of the thermoplastic resin, the number average molecular weight thereof is preferably 10,000 or less and more preferably 5,000 or less from the viewpoint of better compatibility with the polysiloxane compound. On the other hand, the number average molecular weight is preferably 10,000 or more and more preferably 100,000 or more from the viewpoint of higher toughness of the resulting cured product. Although there are no particular limitations on the molecular weight distribution as well, the molecular weight distribution is preferably 3 or less, more preferably 2 or less and even more preferably 1.5 or less from the viewpoints of lower viscosity of the mixture and better moldability.

Although there are no particular limitations on the incorporated amount of the thermoplastic resin, the amount used is preferably in the range of 5 to 50% by weight and more preferably 10 to 30% by weight of the entire curable composition. If the added amount is excessively low, the resulting cured product tends to become brittle. If the added amount is excessively high, heat resistance (modulus of elasticity at high temperatures) tends to decreases.

A single thermoplastic resin may be used, or a plurality thereof may be used in combination.

The thermoplastic resin may be dissolved in the polysiloxane compound and mixed in a homogeneous state, may be crushed and mixed in a particulate state, or may be treated, for example dissolved in a solvent and mixed, so as to form a dispersed state. The thermoplastic resin is preferably dissolved in the polysiloxane compound and mixed in a homogeneous state from the viewpoint of higher transparency of the resulting cured product. In this case as well, the thermoplastic resin may be dissolved directly in the polysiloxane compound, or may be uniformly mixed using a solvent or the like, and subsequently subjected to removal of the solvent so as to form a uniformly dispersed state or/and mixed state.

In the case of dispersing the thermoplastic resin, although the average particle diameter can be set to various values, the preferable lower limit of the average particle diameter is 10 nm and the preferable upper limit of the average particle diameter is 10 µm. Although the particle system may have a distribution, and may be monodispersed or have a plurality of peak particle diameters, the coefficient of variation of the particle diameter is preferably 10% or less from the viewpoints of lower viscosity of the curable composition and better moldability.

(Filler)

In the curable composition, a filler may be added as necessary.

Although various substances can be used as the filler, examples thereof include silica-based fillers such as quartz, fumed silica, precipitated silica, silicic anhydride, fused silica, crystalline silica and ultrafine amorphous silica, and inorganic fillers such as silicon nitride, silver powder, alumina, aluminum hydroxide, titanium oxide, glass fiber, carbon fiber, mica, carbon black, graphite, diatomaceous earth, white clay, clay, talc, calcium carbonate, magnesium carbonate, barium sulfate and inorganic balloons, as well as fillers commonly used or/and proposed for use as fillers of conventional sealing materials such as epoxy sealing materials.

(Anti-Aging Agent)

An anti-aging agent may be added in the curable composition of the present invention. In addition to commonly used anti-aging agents such as hindered phenols, other examples of the anti-aging agent include citric acid, phosphoric acid and sulfur-based anti-aging agents.

Examples of the hindered phenol anti-aging agents include various compounds such as Irganox 1010 available from Ciba Specialty Chemicals.

Examples of the sulfur-based anti-aging agents include mercaptans, mercaptan salts, sulfide carboxylic acid esters, sulfides including hindered phenol-based sulfides, polysulfides, dithiocarboxylic acid salts, thioureas, thiophosphates, sulfonium compounds, thioaldehydes, thioketones, mercaptals, mercaptoles, monothio acids, polythio acids, thioamides and sulfoxides.

These anti-aging agents may be used alone or two or more of these may be used in combination.

(Radical Inhibitor)

A radical inhibitor may also be added in the curable composition of the present invention. Examples of the radical inhibitor include phenol-based radical inhibitors such as 2,6-di-t-butyl-3-methylphenol (BHT), 2,2'-methylene-bis(4-methyl-6-t-butylphenol) and tetrakis(methylene-3 (3,5-di-t-butyl-4-hydroxyphenyl)propionate)methane, and amine-based radical inhibitors such as phenyl-β-naphthylamine, α-naphthylamine, N,N'-secondary-butyl-p-phenylenediamine, phenothiazine and N,N'-diphenyl-p-phenylenediamine.

These radical inhibitors may be used alone or two or more of these may be used in combination.

(Ultraviolet Absorber)

An ultraviolet absorber may also be added in the curable composition of the present invention. Examples of the ultraviolet absorber include 2(2'-hydroxy-3',5'-di-t-butyl-phenyl)benzotriazole and bis(2,2,6,6-tetramethyl-4-piperidine)sebacate.

These ultraviolet absorbers may be used alone or two or more of these may be used in combination.

(Solvent)

The polysiloxane compound used in the curable composition of the present invention can be used dissolved in a solvent in the case it has high viscosity. There are no particular limitations on solvents that can be used, and specific examples of solvents that can be used preferably include hydrocarbon solvents such as benzene, toluene, hexane and heptane, ether solvents such as tetrahydrofuran, 1,4-dioxane, 1,3-dioxolane and diethyl ether, ketone solvents such as acetone, methyl ethyl ketone, methyl isobutyl ketone and cyclohexanone, glycol solvents such as propylene glycol-1-monomethyl ether-2-acetate (PGMEA) and ethylene glycol diethyl ether, and halogen solvents such as chloroform, methylene chloride and 1,2-dichloroethane.

Toluene, tetrahydrofuran, 1,3-dioxolane, propylene glycol-1-monomethyl ether-2-acetate and chloroform are preferable from the viewpoint of hydrosilylation reactivity.

Although the amount of the solvent used can be appropriately set, the preferable lower limit of the amount of solvent used is 0.1 mL relative to 1 g of the curable composition used, while the preferable upper limit of the amount of solvent used is 10 mL. If the amount used is excessively low, the effects of the solvent such as reduction in viscosity are difficult to obtain, while if the amount used is excessively high, thermal cracking and the like due to solvent remaining in the material tend to become a problem, and there is also a disadvantage in terms of cost, thereby lowering the utility value in industry.

The solvent may be used as a single species or two or more species thereof can be used in admixture.

(Other Additives)

Other additives such as colorants, mold release agents, flame retardants, flame retardant promoters, surfactants, antifoaming agents, emulsifiers, leveling agents, cissing inhibitors, ion trapping agents such as antimony-bismuth compounds, thixotropic agents, tackifiers, storage stability improvers, antiozonants, photostabilizers, thickeners, plasticizers, reactive diluents, antioxidants, thermal stabilizers, electrical conductivity-imparting agents, antistatic agents, radiation blockers, nucleating agents, phosphorous-based peroxide decomposers, lubricants, pigments, metal deactivators, thermal conductivity-imparting agents and property modifiers can be added in the curable composition of the present invention as long as they do not impair the objects and effects of the present invention.

(Curable Composition Preparation and Curing Methods)

There are no particular limitations on the method used to prepare the curable composition and it can be prepared by various methods. The curable composition may be prepared by mixing components immediately prior to curing, or the curable composition may be stored at a low temperature in the form of one pack in which all components have been mixed in advance.

A light source that emits light at the absorption wavelength of the polymerization initiator or sensitizer used may be used as the light source for carrying out photocuring, and a light source can normally be used that contains a wavelength within the range of 200 to 450 nm, examples of which include a high-pressure mercury lamp, ultra-high-pressure mercury lamp, metal halide lamp, high-power metal halide lamp, xenon lamp, carbon arc lamp and light-emitting diode.

Although there are no particular limitations on the amount of exposure, the amount of exposure is preferably in the range of 1 to 5000 $mJ/cm^2$ and more preferably 1 to 1000 $mJ/cm^2$. If the amount of exposure is excessively low, curing does not occur. If the amount of exposure is excessively high, discoloration may occur due to too rapid curing. Curing time is preferably within the range of 30 to 120 seconds and more preferably 1 to 60 seconds. If curing time is excessively long, it is not possible to take advantage of the characteristic of rapid curing with respect to photocuring.

In addition, pre-baking and after-baking may be carried out by applying heat before and after photocuring for the purpose of removing solvent and improving physical properties of the cured product. Although the curing temperature can be set to various temperatures, the temperature range is preferably 60 to 400° C. and more preferably 90 to 350° C.

(Laminate)

Since the curable composition of the present invention can be easily formed into a thin film by handling in a liquid state and solution coating, a laminate can be easily formed by curing in layers on a base material.

More specifically, the laminate of the present invention can be produced, for example, by the method described below. The above-mentioned polysiloxane composition is coated onto a base material by a method such as spin coating, roll coating, printing or bar coating to form a film with a thickness of normally 0.05 to 100 μm, preferably 0.1 to 50 μm and more preferably 0.5 to 20 μm. Examples of the base material include glass, polycarbonates, films, silicon wafers on which an image pickup element has been formed, colored resin films patterned for a color filter for LCD or CCD, printing paper, printing fibers and metal plates. Next, the coated polysiloxane composition is exposed to an active energy beam as previously described whereby a laminate can be obtained.

The laminate obtained in this manner can then be developed by an alkali developing solution as described below.

(Alkali Developing Method)

There are no particular limitations on the method for pattern forming by alkali development, and a desired pattern can be formed by dissolving and removing an unexposed portion by a commonly employed developing method such as immersion or spraying.

Here, a commonly used developing solution can be used without any particular limitations, specific examples of which include organic alkali aqueous solutions such as an aqueous tetramethyl ammonium hydroxide solution and aqueous choline solution, inorganic alkali aqueous solutions such as an aqueous potassium hydroxide solution, aqueous sodium hydroxide solution, aqueous potassium carbonate solution, aqueous sodium carbonate solution and aqueous lithium carbonate solution, and solutions obtained by adding an alcohol, surfactant or the like to these aqueous solutions to adjust dissolution rate and the like.

The concentration of the aqueous solution is preferably 25% by weight or less, more preferably 10% by weight or less and even more preferably 5% by weight or less from the viewpoint of sharper contrast between exposed portions and unexposed portions.

(Resin Film)

The resin film (thin film) of the present invention is characterized by having insulating properties such that it has a leakage current of 10 nA/cm$^2$ or less when a voltage of 30 V is applied between metal electrodes between which a resin layer thereof is formed at a thickness of 1 μm. As a result of having such high insulating properties, the thin film in the case of use as an insulator for electronic components and semiconductors enables these electronic components and semiconductors to be made smaller and thinner than in the past.

In particular, the thin film of the present invention can be applied to passivation layers and gate insulating films of electronic components requiring high insulating properties such as thin film transistors. The thin film transistors referred to here indicate field effect transistors (FET), which are thin film transistors that are of the three-terminal type formed of a source, a drain and gate electrodes or of the four-terminal type further containing a back gate, and control current between the source and the drain by a channel electric field generated by applying a voltage to the gate electrodes. In general, silicon materials are typically used for the semiconductor layer and the semiconductor layer is mainly formed by CVD. The resulting crystalline state varies according to the formation method, examples of which include amorphous silicon (a-Si), polysilicon (p-Si) and microcrystalline silicon (μ-cSi), and their electrical properties differ, resulting in the current fact that they are each applied according to the particular application. Similarly to the semiconductor layer, an $SiN_X$ film or $SiO_2$ film formed by CVD is used for the gate insulator and passivation layer even in the case of forming any Si-based transistor. However, from the recent viewpoint of reducing TFT production costs, there is a growing desire for conversion to the insulator formation by solution coating and for development of materials suitable for this purpose, which are expected to eliminate the use of large vacuum systems and enable a reduction in the number of processing steps. The thin film of the present invention can also be applied as an insulator to any of the above-mentioned semiconductor layers without any particular limitations.

In addition, the thin film of the present invention can also be applied as an insulator to transistors other than those with the above-mentioned Si-based semiconductors, as known as next-generation transistors. Examples of materials for the next-generation transistors include oxide semiconductors such as ZnO and InGaZnO, which are attracting attention as promising candidates of drive transistors for OLED displays since they can be formed at lower temperatures by sputtering without using a high-temperature process in the manner of CVD and allow the obtaining of higher electrical mobility than that of a-Si TFT which is currently the mainstream of drive transistors for LCD displays etc.; and organic semiconductors using compounds such as pentacene, oligothiophene or phthalocyanine which enable the formation of transistors by the printing method and on which extensive research and development are being conducted as materials suitable for flexible displays such as electronic paper using plastic film substrates or the like. From the viewpoint that a high-temperature CVD process cannot be applied upon the insulator formation or that otherwise the advantages of these materials are lost, these materials are required to be formed under mild conditions by solution coating, and the thin film of the present invention can be said to be a particularly preferable material for use as an insulator.

When forming an electrical device such as a thin film transistor, since the presence of leakage current or the like in the insulating layer leads to signal response delays, erroneous operation and device defects, the insulator thereof is required to have high insulating properties. Specifically, since an insulator formed from a resin composition such as that film able to be formed by solution coating cannot be applied when the amount of leakage current thereof is excessively large upon applying a voltage to the thin film, the insulating properties of the insulator are required to be such that the amount of leakage current between electrodes is 20 nA/cm$^2$ or less when a voltage of 30 V is applied to a thin film thereof with a thickness of 1 μm or less formed between the electrodes. Moreover, in consideration of reliability for electronic components, the amount of leakage current is preferably 10 nA/cm$^2$ or less and more preferably 5 nA/cm$^2$.

With respect to the film thickness of the insulator, insulating reliability tends to increase with larger film thickness, and the amount of leakage current between electrodes thus tends to decrease, but in the case of application to insulators of LSI elements, TFT or the like, the insulator preferably has high insulating properties at a thin film thickness in order to reduce the element size and the thickness, and preferably has an amount of leakage current between electrodes as indicated above at a film thickness of the insulator of preferably 1.0 μm or less, more preferably 0.5 μm or less and even more preferably 0.3 μm or less. Moreover, in order to form a multilayer structure upon transistor formation, it is preferable that the film thickness is even thinner and the insulating properties are maintained, and the insulator preferably has an amount of leakage current between electrodes as indicated above in the form of a thin film with a film thickness of preferably 0.2 μm or less and more preferably 0.1 μm or less.

Moreover, this insulator preferably has superior environmental resistance, and preferably maintains the insulating properties thereof even in the case of long-term storage under low-temperature conditions of −60 to 0° C., high-temperature conditions of 20 to 100° C. and high-temperature and high-humidity conditions of 20 to 90° C. at 20 to 100% RH.

Although there is no problem with respect to the applied voltage if the leakage current is small at a voltage level ordinarily applied as a drive voltage of TFT, in consideration of long-term reliability and momentary overvoltages immediately after application, the amount of leakage current at any voltage value preferably between 0 and 50 V is preferably at a low level as described above, and the insulating properties are preferably maintained at the level indicated above upon applying a voltage of more preferably 0 to 100 V and even more preferably 0 to 200 V regardless of AC voltage or DC voltage.

(Resin Composition)

There are no particular limitations on a resin composition able to be used for the resin film of the present invention provided it can be coated as a solution and provides a thin film that demonstrates high insulating properties as a result of a crosslinking reaction caused by energy such as heat or light from the outside.

Examples of the resin composition include epoxy compounds, acrylic compounds, phenol compounds, benzoxazole compounds, imide compounds, cyanate compounds, fluorine compounds and polysiloxane compounds.

A resin composition containing a polysiloxane compound as a main component thereof is preferable from the viewpoints of high transparency and superior heat resistance of the formed thin film.

Although there are no particular limitations on the polysiloxane compound contained in the resin composition, one having a cyclic polysiloxane structure formed from 3 to 10 Si atoms in a molecule thereof is preferable, and it allows solution coating in a liquid state, and also can provide a thin film that has a structure with a high crosslinked density after curing and has high insulating properties. Since polysiloxane compounds not having a crosslinking reactive site in a cyclic polysiloxane structure cause the reliability of the film to be impaired due to outgassing, bleeding and the like, the polysiloxane compound preferably has a crosslinkable reactive group, and is preferably a cyclic organopolysiloxane having at least one crosslinkable reactive group in a molecule thereof as represented by the following general formula (V):

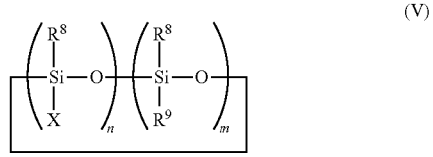

(wherein, $R^8$ and $R^9$ each represent a non-crosslinkable organic group having 1 to 6 carbon atoms, X represents a hydrogen atom (SiH group) or an organic group having 0 to 10 carbon atoms and having a crosslinkable reactive group selected from an epoxy group, (meth) acryloyl group, alkoxysilyl group and vinyl group, and Xs may be the same or different, n represents a number of 1 to 10 and m represents a number of 0 to 10).

In addition, from the viewpoint of obtaining a thin film having superior insulating properties and dielectric strength, the polysiloxane compound is preferably a compound as represented by a silsesquioxane having a polyhedral structure described for the above-mentioned compound (α2), and particularly preferably having a polysiloxane structure with a polyhedral backbone formed from 6 to 24 Si atoms in a molecule thereof.

In addition, from the viewpoint of giving a tough thin film, an oligomer can be used which is obtained by partially reacting a cyclic siloxane having a crosslinkable functional group with another organic compound or polysiloxane compound in advance. Although there are no particular limitations on this partial crosslinking reaction, a hydrosilylation is preferably applied from the viewpoints that more electrically and thermally stable C—Si bonds are formed as a result of the reaction in comparison with a hydrolytic condensation, that the reaction is controlled easily, and that the residual amount of uncrosslinked groups is smaller.

There are no particular limitations on monomers to be partially crosslinked, and appropriate combinations of a cyclic siloxane containing one or more SiH groups or alkenyl groups in a molecule thereof, and a siloxane compound or organic compound containing one or more alkenyl groups or SiH groups in a molecule thereof can be used.

Examples of the cyclic siloxane containing one or more SiH groups in a molecule thereof include 1,3,5,7-tetrahydrogen-1,3,5,7-tetramethylcyclotetrasiloxane, 1-methyl-3,5,7-trihydrogen-1,3,5,7-tetramethylcyclotetrasiloxane, 1,3-dimethyl-5,7-dihydrogen-1,3,5,7-tetramethylcyclotetrasiloxane, 1-propyl-3,5,7-trihydrogen-1,3,5,7-tetramethylcyclotetrasiloxane, 1,3-dipropyl-5,7-dihydrogen-1,3,5,7-tetramethylcyclotetrasiloxane, 1,3,5-trihydrogen-7-hexyl-1,3,5,7-tetramethylcyclotetrasiloxane, 1,5-dihydrogen-3,7-dihexyl-1,3,5,7-tetramethylcyclotetrasiloxane, 1,3,5-trihydrogen-trimethylcyclosiloxane, 1,3,5,7,9-pentahydrogen-1,3,5,7,9-pentamethylcyclosiloxane and 1,3,5,7,9,11-hexahydrogen-1,3,5,7,9,11-hexamethylcyclosiloxane. From the viewpoint of availability in particular, 1,3,5,7-tetrahydrogen-1,3,5,7-tetramethylcyclotetrasiloxane is preferable.

Examples of other compounds containing an SiH group include poly- or oligosiloxanes in which an end thereof is blocked with a dimethylhydrosilyl group, poly- or oligosiloxanes containing an SiH group in a side chain thereof, tetramethyldisiloxane, and SiH compounds containing an alkoxysilyl group such as dimethoxymethylsilane, methoxydimethylsilane, diethoxymethylsilane, ethoxydimethylsilane and triethoxysilane.

Compounds containing one or more alkenyl groups in a molecule thereof can also be used without any particular limitations regardless of whether they are polysiloxane compounds or organic compounds.

Specific examples of linear polysiloxanes containing an alkenyl group include poly- or oligosiloxanes in which an end thereof is blocked with a dimethylvinylsilyl group, poly- or oligosiloxanes having a vinyl group in a side chain thereof, tetramethyldivinyldisiloxane, hexamethyltrivinyltrisiloxane, and those in which an SiH group of the above-mentioned examples of cyclic siloxanes containing an SiH group is substituted with an alkenyl group such as a vinyl group or allyl group.

There are no particular limitations on the alkenyl group-containing organic compound provided it is a compound composed of atoms selected from the group consisting of C, H, N, O, S and halogen atoms as constituent elements thereof, but not containing a siloxane unit (Si—O—Si) in the manner of polysiloxane-organic block copolymers and polysiloxane-organic graft copolymers, and at the same time it is an organic compound that has, in a molecule thereof, one or more carbon-carbon double bonds having reactivity with SiH groups. The following compound (α2) can be used from the viewpoint of availability.

The resin composition is preferably the above-mentioned curable composition of the present invention having photolithographic properties with alkali-developability, or in other words, a curable composition containing the polysiloxane compound of the present invention since the curable composition can be handled in a liquid state and easily formed into a thin film by solution coating, has high insulating properties and enables easy formation of through holes and the like.

(Thin Film Formation Method)

There are no particular limitations on the method used to form a thin film from the resin composition in the present invention, and the film can be formed by a method such as spin coating or slit coating. In addition, viscosity adjustment using a solvent and adjustment of surface tension with a surfactant may be appropriately carried out according to the condition of a base material on which the film is to be formed.

In the case of using the curable composition of the present invention, high insulating properties can be realized by allowing a crosslinking reaction to proceed with light or heat after film formation. Although there are no particular limitations on the heating temperature following film formation, the temperature is preferably 250° C. or lower from the viewpoint of smaller effects on electronic members surrounding the transistor which have low heat resistance, the temperature is preferably 200° C. or higher in order to form the transistor on a transparent resin substrate typically exemplified by PEN or PES, the temperature is preferably 150° C. or lower in consideration of dimensional stability, heat resistance and the like of resin substrates, and insulating properties are preferably demonstrated by heating at a temperature of more preferably 100° C. or lower.

(Applications)

The polysiloxane compound of the present invention, a curable composition thereof or a cured product thereof can be used in various applications. It can be applied in various applications in which conventional acrylic resin and epoxy resin adhesives are used.

The present invention can be applied to transparent materials, optical materials, optical lenses, optical films, optical sheets, adhesives for optical components, optical adhesives for optical waveguide coupling, adhesives for fixing members surrounding optical waveguides, adhesives for DVD lamination, pressure-sensitive adhesives, dicing tape, electronic materials, insulating materials (including printed boards and wire coverings), high-voltage insulating materials, interlayer insulators, TFT passivation layers, TFT gate insulators, TFT interlayer insulators, TFT transparent planarization films, insulating packings, insulating covering materials, adhesives, highly heat-resistant adhesives, high heat-radiation adhesives, optical adhesives, LED element adhesives, adhesives for various substrates, heat sink adhesives, coatings, UV powder coatings, inks, colored inks, UV inkjet inks, coating materials (including hard coatings, sheets, films, release paper coatings, optical disc coatings and optical fiber coatings), molded materials (including sheets, films and FRP), sealing materials, potting materials, encapsulants, encapsulants for light-emitting diodes, optical semiconductor encapsulants, liquid crystal sealants, display device sealants, electrical material encapsulants, encapsulants for various solar cells, heat-resistant sealing materials, resist materials, liquid resist materials, colored resists, dry film resist materials, solder resist materials, color filter binder resins, transparent planarization materials for color filters, black matrix binder resins, photo spacer materials for liquid crystal cells, transparent encapsulants for OLED elements, stereo lithography, solar cell materials, fuel cell materials, display materials, recording materials, vibration damping materials, waterproof materials, moisture-resistant materials, heat shrinkable rubber tubes, O-rings, copier photosensitive drums, battery solid electrolytes and gas separation films. In addition, other examples of applications include concrete protective materials, linings, soil injection agents, cold heat storage materials, sealing materials for disinfection devices, contact lenses, oxygen-permeable films as well as additives for other resins and the like.

In particular, the curable composition of the present invention is a material that can be used as an alkali-developable transparent resist, and is particularly preferable as an FPD material. Specific examples of such applications include TFT passivation layers, TFT gate insulators, TFT interlayer insulators, TFT transparent planarization films, color filter binder resins, transparent planarization materials for color filters, black matrix binder resins, photo spacers for liquid crystal cells, and transparent encapsulants for OLED elements.

EXAMPLES

Although the following indicates examples and comparative examples of the present invention, the present invention is not limited thereto.

(NMR)

A 300 MHz NMR system (manufactured by Varian Technologies Japan Limited.) was used. The Reaction rate of allyl groups during synthesis was calculated from peaks derived from unreacted allyl groups/vinyl groups and peaks derived from reacted allyl groups/vinyl groups by adding dilutions of the reaction liquid diluted to about 1% with chloroform-d to NMR tubes and measuring.

(Evaluation of Alkali Solubility)

Each of curable compositions obtained from the examples and comparative examples was coated onto a glass plate to a thickness of about 50 μm followed by allowing the solvents to dry in air, immersing the residue in an alkaline developing solution (2.38% TMAH aqueous solution) for 60 seconds, rinsing it with water, and evaluating the solubility based on the presence or absence of residual resin at the portion immersed in the developing solution (the evaluation was carried out using a 25% aqueous solution of TMAH in Example 7 only).

(Evaluation of Alkali Resistance)

Each of curable compositions obtained from the examples and comparative examples was coated onto a glass plate (50×100×0.7 mm) by spin coating, and exposed to a cumulative amount of light of 200 mJ/cm$^2$ with a conveyor-type exposure apparatus (high-pressure mercury lamp, LH6 from Fusion UV Systems). The presence of surface tack and the curing state were evaluated with a spatula. In addition, the developing solution resistance of the cured films was evaluated visually by immersing in an alkali developing solution (2.38% TMAH aqueous solution) for 5 minutes.

(Heat Resistance Test)

Each of curable compositions obtained from the examples and comparative examples was coated onto a glass plate (50×100×0.7 mm) by spin coating and exposed to a cumulative amount of light of 200 mJ/cm$^2$ with a conveyor-type exposure apparatus (high-pressure mercury lamp, LH6 from Fusion UV Systems). Subsequently, samples were produced by carrying out post-baking for 30 minutes at 150° C. The samples were aged for 24 hours in a hot air circulating oven set to a temperature of 200° C. followed by measurement of the light transmittance.
(Light Resistance Test)

Each of curable compositions obtained from the examples and comparative examples was coated onto a glass plate (50×100×0.7 mm) by spin coating and exposed to a cumulative amount of light of 200 mJ/cm$^2$ with a conveyor-type exposure apparatus (high-pressure mercury lamp, LH6 from Fusion UV Systems). Subsequently, samples were produced by carrying out post-baking for 30 minutes at 150° C. The samples were tested using a metaling weather meter (Model M6T) manufactured by Suga Test Instruments. The light transmittance was measured after irradiating the samples at a black panel temperature of 120° C. and irradiance of 0.53 kW/m$^2$ to a cumulative irradiance of 50 MJ/m$^2$.
(Light Transmittance)

The light transmittance was measured at wavelengths of 700 nm and 400 nm using a V-560 ultraviolet-visible spectrophotometer (JASCO).
(Evaluation of Insulating Properties)

Samples for evaluating insulating properties were produced in the manner described below using resin compositions obtained from the examples and comparative examples. After spin-coating (rotating speed: 2000 rpm, 30 seconds) the resin composition onto an SUS plate of which the surface had been polished with #400 paper, the coated resin composition was exposed to a cumulative amount of light of 200 mJ/cm$^2$ with a conveyor-type exposure apparatus (high-pressure mercury lamp, LH6 from Fusion UV Systems). Subsequently, a thin film was formed by heating for 1 hour on a hot plate heated to 250° C. Moreover, an Au electrode was formed at a size of 1 cm$^2$ square on the thin film by sputtering so that the surface resistance was 50 Ω/cm$^2$ or less.

In addition, insulating properties were evaluated using a semiconductor parameter measuring system (Model 4156C, Agilent) by applying a voltage of 0 to 50 V in 0.5 V increments between electrodes (SUS-Au) placed on both sides of an insulator, and measuring the amount of leakage current per unit electrode surface area when applying a voltage of 30 V.
(Measurement of Film Thickness)

After forming a thin film on an SUS plate, the film thickness was calculated by measuring the reflectance at wavelengths of 700 nm and 400 nm using a V-560 ultraviolet-visible spectrophotometer (JASCO).

Example 1

100 g of toluene and 57.49 g of 1,3,5,7-tetramethylcyclotetrasiloxane were placed in a 500 mL four-mouth flask followed by replacing the gas phase with nitrogen and heating and stirring at an internal temperature of 105° C. A mixed liquid of 10.0 g of diallyl isocyanuric acid, 70.0 g of 1,4-dioxane and 0.0186 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product A".

20 g of toluene and 10 g of "Reaction product A" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain "Reaction product 1".

Example 2

20 g of toluene and 10 g of "Reaction product A" were placed in a 100 mL four-mouth flask followed by replacing the gas phase with nitrogen, heating at an internal temperature of 105° C., adding a mixture of 3.7 g of vinyltrimethoxysilane and 3.0 g of toluene thereto, and confirming the degree of reaction of vinyl groups to be 95% or more by $^1$H-NMR 3 hours after addition. The reaction liquid was then cooled to obtain "Reaction product 2".

Example 3

20 g of toluene and 10 g of "Reaction product A" were placed in a 100 mL four-mouth flask followed by replacing the gas phase with nitrogen, heating at an internal temperature of 85° C., adding a mixture of 3.2 g of allyl methacrylate, 3.0 g of toluene and 0.01 g of a xylene solution of platinum-vinylsiloxane complex (containing 3% by weight of platinum) thereto, and confirming the degree of reaction of allyl groups to be 95% or more by $^1$H-NMR 7 hours after addition. The reaction liquid was then cooled to obtain "Reaction product 3".

Example 4

175 g of toluene and 86.23 g of 1,3,5,7-tetramethylcyclotetrasiloxane were placed in a 500 mL four-mouth flask followed by replacing the gas phase with nitrogen, and heating and stirring at an internal temperature of 105° C. A mixed liquid of 7.5 g of diallyl isocyanuric acid, 5.95 g of triallyl isocyanurate, 70.0 g of 1,4-dioxane and 0.0280 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product B".

20 g of toluene and 10 g of "Reaction product B" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain "Reaction product 4".

Example 5

602 g of toluene and 626 g of 1,3,5,7-tetramethylcyclotetrasiloxane were placed in a 2 L autoclave followed by replacing the gas phase with nitrogen and heating and stirring at an internal temperature of 105° C. A mixed liquid of 90.0 g of triallyl isocyanurate, 90.0 g of toluene and 0.0570 g of a xylene solution of platinum-vinylsiloxane complex (containing 3% by weight of platinum) was added dropwise over the course of 40 minutes. Four hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product C".

Moreover, 20 g of toluene and 7.25 g of "Reaction product C" were placed in a 100 mL four-mouth flask followed by replacing the gas phase with nitrogen, heating at an internal temperature of 105° C., adding 2.75 g of vinylcyclohexene oxide and stirring for 2 hours. Further, 0.9 g of monoallyl isocyanuric acid and 0.001 g of a xylene solution of platinum-vinylsiloxane complex (containing 3% by weight of platinum) were added followed by confirming the degree of reaction of vinyl and allyl groups to be 95% or more by $^1$H-NMR 3 hours after addition. The reaction liquid was then cooled to obtain "Reaction product 5".

Example 6

20 g of toluene and 7.25 g of "Reaction product C" were placed in a 100 mL four-mouth flask followed by replacing the gas phase with nitrogen, heating at an internal temperature of 105° C., adding 2.75 g of vinylcyclohexene oxide and stirring for 2 hours. Moreover, 2.2 g of diallyl bisphenol and 0.001 g of a xylene solution of platinum-vinylsiloxane complex (containing 3% by weight of platinum) were added followed by confirming the degree of reaction of vinyl and allyl groups to be 95% or more by $^1$H-NMR 3 hours after addition. The reaction liquid was then cooled to obtain "Reaction product 6".

Example 7

20 g of toluene and 7.25 g of "Reaction product C" were placed in a 100 mL four-mouth flask followed by replacing the gas phase with nitrogen, heating at an internal temperature of 105° C., adding 2.75 g of vinylcyclohexene oxide and stirring for 2 hours. Moreover, a mixed liquid of 2.8 g of allyl phenol and 2.8 g of toluene was added followed by confirming the degree of reaction of vinyl and allyl groups to be 95% or more by $^1$H-NMR 3 hours after addition. The reaction liquid was then cooled to obtain "Reaction product 7".

Comparative Example 1

15 g of toluene and 7.5 g of 1,3,5,7-tetramethylcyclotetrasiloxane were placed in a 100 mL four-mouth flask followed by replacing the gas phase with nitrogen, heating at an internal temperature of 105° C., adding 5.0 g of vinylcyclohexene oxide and stirring for 2 hours. The degree of reaction of vinyl groups was confirmed to be 95% or more by $^1$H-NMR 2 hours after addition. The reaction liquid was then cooled to obtain "Comparative Reaction product 1".

Comparative Example 2

20 g of toluene and 7.25 g of "Reaction product C" were placed in a 100 mL four-mouth flask followed by replacing the gas phase with nitrogen, heating at an internal temperature of 105° C., adding a mixed liquid of 2.75 g of vinylcyclohexene oxide, 0.001 g of a xylene solution of platinum-vinylsiloxane complex (containing 3% by weight of platinum) and 2.8 g of toluene, and confirming the degree of reaction of vinyl groups to be 95% or more by $^1$H-NMR 2 hours after addition. The reaction liquid was then cooled to obtain "Comparative Reaction product 2".

Examples 8 to 14 and Comparative Examples 3 to 5

Curable compositions were produced based on the formulations shown in Table 1 using the Reaction products obtained in Examples 1 to 7 and Comparative Examples 1 and 2, followed by evaluation in the manner described above. The results are shown in Table 2.

| | Example 8 | Example 9 | Example 10 | Example 11 | Example 12 | Example 13 | Example 14 | Comparative Example 3 | Comparative Example 4 | Comparative Example 5 |
|---|---|---|---|---|---|---|---|---|---|---|
| Formulation | | | | | | | | | | |
| Reaction product 1 | 100 | | | | | | | | | |
| Reaction product 2 | | 100 | | | | | | | | |
| Reaction product 3 | | | 100 | | | | | | | |
| Reaction product 4 | | | | 100 | | | | | | |
| Reaction product 5 | | | | | 100 | | | | | |
| Reaction product 6 | | | | | | 100 | | | | |
| Reaction product 7 | | | | | | | 100 | | | |
| Comparative Reaction product 1 | | | | | | | | 100 | | |
| Comparative Reaction product 2 | | | | | | | | | 100 | |
| Epoxy compound | | | | | | | | | | 50 |
| Solvent | | | | | | | | | | 50 |
| Cationic polymerization initiator | 8 | 4 | | 4 | 4 | 2 | 2 | 2 | 2 | 2 |
| Radical polymerization initiator | | | 5 | | | | | | | |

※ Expressed by parts by weight
※ 25% Aqueous solutions of TMAH used
Solvent (propylene gylcol monomethyl ether acetate, PGMEA)
Cationic polymerization initiator ( Product name: Rhodorsil PI2074, Phodia)
Radical polymerization initiator (Product name: Darocure 1173, Ciba Speciality Chemicals)
Photocurable epoxy compound (Product name: 2021P, Daicel Chemical Industries)

|  | Example 13 | Example 9 | Example 10 | Example 11 | Example 12 | Example 13 | Example 14 | Comparative Example 3 | Comparative Example 4 | Comparative Example 5 |
|---|---|---|---|---|---|---|---|---|---|---|
| Alkali solubility | Dissolved | Dissolved | Dissolved | Dissolved | Dissolved | Dissolved | Dissolved * | Not dissolved | Not dissolved | Not dissolved |
| Curability |  |  |  |  |  |  |  |  |  |  |
| Curing state | Cured | Cured | Cured | Cured | Cured | Cured | Cured | Cured | Cured | Cured |
| Alkali resistance of cured film | Not changed | Not changed | Not changed | Not changed | Not changed | Not changed | Not changed | Not changed | Not changed | Not changed |
| Heat resistance |  |  |  |  |  |  |  |  |  |  |
| Appearance of coating after test | Colorless, transparent | Colorless, transparent | Colorless, transparent | Colorless, transparent | Colorless, transparent | Colorless, transparent | Colorless, transparent | Color less, transparent | Colorless, transparent | Brown |
| Light transmittance after test (at 500 nm) | 92 | 92 | 92 | 92 | 92 | 92 | 89 | 92 | 92 | 70 |

※ 25% Aqueous solution of TMAH used

Since a curable composition obtained by using the modified polyorganosiloxane compound of the present invention provides a cured product having superior heat-resistant transparency, and has alkali solubility and photocurability in comparison with the compositions produced in the comparative examples, and therefore it can be applied as an alkali-developable resist material.

Example 15

A mixed solution of 0.06 g of diallyl isocyanuric acid, 2.43 g of diethoxymethylvinylsilane, 5.89 μL of platinum-vinylsiloxane complex (Pt-VTSC-3.0x, N.E. Chemcat) and 2.0 g of 1,4-dioxane was slowly added dropwise to a solution of 2.0 g of octa (dimethylsiloxy) octasilsesquioxane, which is a polyhedral polysiloxane containing dimethylsiloxy groups, and 6.0 g of toluene, followed by allowing the reaction to proceed for 5 hours at 80° C. Following completion of the reaction, the solvent component was distilled off to obtain 3.8 g of a polysiloxane compound as a clear liquid. The resulting compound was a clear liquid, the allyl groups and vinyl groups of the diallyl isocyanuric acid and diethoxymethylvinylsilane were confirmed to no longer be present and the target structure was confirmed to have been introduced into the polysiloxane compound by $^1$H-NMR.

1 g of said polysiloxane compound was diluted with 2 g of methyl isobutyl ketone and coated onto a glass substrate (slide glass) with a dropper. Next, when the resulting glass substrate was immersed in an alkali developing solution (2.38 wt % aqueous tetramethyl ammonium hydroxide solution), the immersed portion of the polysiloxane composition was visually confirmed to be dissolved and be able to be removed from the glass substrate.

Production Example 1

A mixed solution of 2 g of diallyl isocyanuric acid, 57.3 μL, of platinum-vinylsiloxane complex (Pt-VTSC-3.0x, N.E. Chemcat) and 15 g of 1,4-dioxane was slowly added dropwise to a solution of 12.84 g of 1,1,3,3-tetramethyldisiloxane and 10.0 g of toluene, followed by allowing the reaction to proceed for 10 hours at 60° C. Following completion of the reaction, the solvent component and the 1,1,3,3-tetramethyldisiloxane added in excess were distilled off to obtain 4.0 g of a viscous liquid compound. SiH groups derived from the 1,1,3,3-tetramethyldisiloxane were confirmed to have been introduced into the compound by $^1$H-NMR.

Example 16

A mixed solution of 0.23 g of the compound synthesized in Production Example 1, 1.62 g of diethoxymethylsilane, 0.49 μL of platinum-vinylsiloxane complex (Pt-VTSC-3.0x, N.E. Chemcat) and 2.0 g of toluene was slowly added dropwise to a solution of 2.0 g of octa(vinyldimethylsiloxy) octasilsesquioxane, which is a polyhedral polysiloxane containing vinyldimethylsiloxy groups, and 2.0 g of toluene, followed by allowing the reaction to proceed for 5 hours at 80° C. Following completion of the reaction, the solvent component was distilled off to obtain 3.5 g of a polysiloxane compound as a clear liquid. The SiH groups of the compound described in Production Example 1 and the diethoxymethylsilane as well as the vinyl groups of the octa(vinyldimethylsiloxy)octasilsesquioxane were confirmed to no longer be present and the target structure was confirmed to have been introduced into the polysiloxane compound by $^1$H-NMR.

1 g of said polysiloxane compound was diluted with 2 g of methyl isobutyl ketone and coated onto a glass substrate (slide glass) with a dropper. Next, when the resulting glass substrate was immersed in an alkali developing solution (2.38 wt % aqueous tetramethyl ammonium hydroxide solution), the immersed portion of the polysiloxane composition was visually confirmed to be dissolved and be able to be removed from the glass substrate.

Example 17

2 g of methyl isobutyl ketone and 0.04 g of a 25 wt % 2-acetoxy-1-methoxypropane solution of Rhodorsil-PI2074 (photoacid generator that is an onium salt, Rhodia) were added to 1 g of the polysiloxane compound obtained in Example 15. The polysiloxane composition obtained in this manner was coated by spin coating (1000 rpm, 20 seconds) onto a glass substrate (50×100×0.7 mm). Roughly half of the glass substrate was covered with a black plastic sheet having a thickness of 3 mm to block light, followed by exposure to a cumulative amount of light of 200 mJ/cm$^2$ using a conveyor-type exposure apparatus (high-pressure mercury lamp, LH6 from Fusion UV Systems).

Next, the glass substrate was immersed for 60 seconds in an alkali developing solution (2.38 wt % aqueous tetramethyl ammonium hydroxide solution) and rinsed with water for 30 seconds followed by observing the status of the blocked portion and the unblocked portion. As a result, a polysiloxane-based film was confirmed to not have been formed at the blocked portion (unexposed portion) and the polysiloxane composition at this portion was confirmed to be able to be removed by immersion in the alkali developing solution and rinsing with water. On the other hand, a polysiloxane-based film was confirmed to have been laminated at the unblocked portion (exposed portion). The film thickness was 2 μm.

As a result of carrying out a heat resistance test and light resistance test on the glass substrate coated with the polysiloxane-based film and measuring the light transmittance, there were no changes in transparency observed by visual evaluation. The results of measuring the light transmittance are shown in Table 3.

Example 18

2 g of methyl isobutyl ketone and 0.04 g of a 25 wt % 2-acetoxy-1-methoxypropane solution of Rhodorsil-PI2074 (photoacid generator that is an onium salt, Rhodia) were added to 1 g of the polysiloxane compound obtained in Example 16. The polysiloxane composition obtained in this manner was coated by spin coating (1000 rpm, 20 seconds) onto a glass substrate (50×100×0.7 mm). Roughly half of the glass substrate was covered with a black plastic sheet having a thickness of 3 mm to block light, followed by exposure to a cumulative amount of light of 200 mJ/cm$^2$ using a conveyor-type exposure apparatus (high-pressure mercury lamp, LH6 from Fusion UV Systems).

Next, the glass substrate was immersed for 60 seconds in an alkali developing solution (2.38 wt % aqueous tetramethyl ammonium hydroxide solution) and rinsed with water for 30 seconds followed by observing the status of the blocked portion and the unblocked portion. As a result, a polysiloxane-based film was confirmed to not have been formed at the blocked portion (unexposed portion) and the polysiloxane composition at this portion was confirmed to be able to be removed by immersion in the alkali developing solution and rinsing with water. On the other hand, a polysiloxane-based film was confirmed to have been laminated at the unblocked portion (exposed portion). The film thickness was 2.3 μm.

As a result of carrying out a heat resistance test and light resistance test on the glass substrate coated with the polysiloxane-based film and measuring the light transmittance, there were no changes in transparency observed by visual evaluation. The results of measuring the light transmittance are shown in Table 3.

Example 19

2 g of methyl isobutyl ketone, 0.005 g of anthracene and 0.04 g of a 25 wt % 2-acetoxy-1-methoxypropane solution of Rhodorsil-PI2074 (photoacid generator that is an onium salt, Rhodia) were added to 1 g of the polysiloxane compound obtained in Example 16. The polysiloxane composition obtained in this manner was coated by spin coating (1000 rpm, 20 seconds) onto a glass substrate (50×100×0.7 mm). This glass substrate was covered with a filter that selectively allows the transmission of light having a wavelength of 365 nm (bandpass filter for mercury lamp exposure, HG0365, Asahi Spectra), and roughly half of the glass substrate was further covered with a black plastic sheet having a thickness of 3 mm to block light, followed by exposure to a cumulative amount of light of 200 mJ/cm$^2$ using a conveyor-type exposure apparatus (high-pressure mercury lamp, LH6 from Fusion UV Systems).

Next, the glass substrate was immersed for 60 seconds in an alkali developing solution (2.38 wt % aqueous tetramethyl ammonium hydroxide solution) and rinsed with water for 30 seconds followed by observing the status of the blocked portion and the unblocked portion. As a result, a polysiloxane-based film was confirmed to not have been formed at the blocked portion (unexposed portion) and the polysiloxane composition at this portion was confirmed to be able to be removed by immersion in the alkali developing solution and rinsing with water. On the other hand, a polysiloxane-based film was confirmed to have been laminated at the unblocked portion (exposed portion). The film thickness was 2.1 p.m.

Comparative Example 6

A mixed solution of 3.78 g of diethoxymethylvinylsilane, 2.0 g of toluene and 1.18 μL of platinum-vinylsiloxane complex (Pt-VTSC-3.0x, N.E. Chemcat) was slowly added dropwise to a solution of 2.0 g of octa (dimethylsiloxy) octasilsesquioxane, which is a polyhedral polysiloxane containing dimethylsiloxy groups, and 6.0 g of toluene, followed by allowing the reaction to proceed for 5 hours at 80° C. Following completion of the reaction, the diethoxymethylvinylsilane added in excess and the solvent component were distilled off to obtain 4.08 g of a polysiloxane compound as a clear liquid. 1 g of the polysiloxane compound was diluted with 2 g of methyl isobutyl ketone and coated onto a glass substrate (slide glass) with a dropper. Next, when the resulting glass substrate was immersed in an alkali developing solution (2.38 wt % aqueous tetramethyl ammonium hydroxide solution), the layer corresponding to the polysiloxane compound was visually confirmed to be undissolved and have remained on the glass substrate.

|  | Light transmittance (%) | | | | | |
|---|---|---|---|---|---|---|
|  | Initial value | | After light resistnace test | | After heat resistance test | |
|  | 700 nm | 400 nm | 700 nm | 400 nm | 700 nm | 400 nm |
| Example 17 | 93.1 | 91.7 | 93 | 91.3 | 93.4 | 91.7 |
| Example 18 | 91.9 | 91.4 | 92.2 | 91.2 | 91.9 | 91.3 |

Example 20

100 g of toluene and 57.49 g of 1,3,5,7-tetramethylcyclotetrasiloxane were placed in a 500 mL four-mouth flask followed by replacing the gas phase with nitrogen and heating and stirring at an internal temperature of 105° C. A mixed liquid of 10.0 g of diallyl isocyanuric acid, 70.0 g of 1,4-dioxane and 0.0186 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product A". 20 g of toluene and 10 g of "Reaction product A" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain a polysiloxane compound.

4 g of methyl isobutyl ketone, 0.005 g of anthracene and 0.04 g of a 25 wt % 2-acetoxy-1-methoxypropane solution of Rhodorsil-PI2074 (photoacid generator that is an onium salt, Rhodia) were added to 1 g of the above-mentioned polysiloxane compound to obtain a resin composition.

Example 21

100 g of toluene and 57.49 g of 1,3,5,7-tetramethylcyclotetrasiloxane were placed in a 500 mL four-mouth flask followed by replacing the gas phase with nitrogen and heating and stirring at an internal temperature of 105° C. A mixed liquid of 10.0 g of vinyl norbornene, 70.0 g of toluene and 0.0186 g of a xylene solution of platinum-vinylsiloxane complex (containing 3% by weight of platinum) was added dropwise over the course of 30 minutes. Six hours after completion of dropping, the degree of reaction of allyl groups was confirmed to be 95% or more by $^1$H-NMR and the reaction was terminated by cooling. Unreacted 1,3,5,7-tetramethylcyclotetrasiloxane and toluene were distilled off under reduced pressure to obtain a colorless, clear liquid referred to as "Reaction product D". 20 g of toluene and 10 g of "Reaction product D" were placed in a 100 mL four-mouth flask followed by replacing the gas phase with nitrogen, heating at an internal temperature of 105° C., adding a mixture of 3.0 g of vinylcyclohexene oxide and 3.0 g of toluene thereto, and confirming the degree of reaction of vinyl groups to be 95% or more by $^1$H-NMR 3 hours after addition. The reaction liquid was then cooled to obtain a polysiloxane compound.

4 g of methyl isobutyl ketone, 0.005 g of anthracene and 0.01 g of a 25 wt % 2-acetoxy-1-methoxypropane solution of Rhodorsil-PI2074 (photoacid generator that is an onium salt, Rhodia) were added to 1 g of the above-mentioned polysiloxane compound to obtain a resin composition.

Comparative Example 7

8 g of methyl isobutyl ketone and 0.05 g of a 25 wt % 2-acetoxy-1-methoxypropane solution of Rhodorsil-PI2074 (photoacid generator that is an onium salt, Rhodia) were added to 1 g of Ethyl silicate-40 (Colcoat) to obtain a resin composition.

The results of carrying out the previously described evaluation of insulating properties, evaluation of alkali solubility and measurement of film thickness using the compositions obtained in the examples and comparative example are shown in Table 4.

TABLE 4

|  | Example 20 | Example 21 | Comparative Example 7 |
|---|---|---|---|
| Amount of leakage current (nA/cm$^2$) | 3.5 | 10 | >100 |
| Film thickness (μm) | 0.5 | 1.0 | 1.0 |
| Alkali developability | + | − | − |

According to these results, since the compositions and thin films of the present invention can be formed by solution coating and have superior insulating properties, they can yield thin film transistors that use the thin film as a passivation layer or gate insulator.

The invention claimed is:

1. An alkali-developable resist material, produced by using a curable composition comprising a polysiloxane compound and at least one selected from the group consisting of a cationic polymerization initiator, a radical polymerization initiator and a photoacid generator, wherein the polysiloxane compound comprises:
   at least one photopolymerizable functional group; and
   at least one member selected from the group consisting of structures represented by the following formulas (X1), and the following formula (X2)

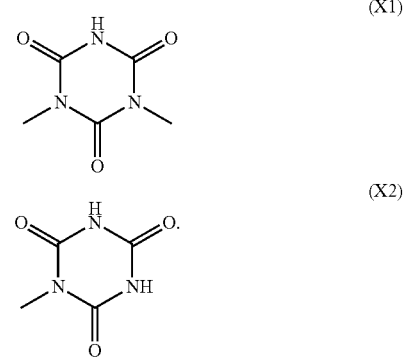

2. The alkali-developable resist material according to claim 1, wherein the photopolymerizable functional group is at least one member selected from the group consisting of an epoxy group, a crosslinkable silicon group and a (meth) acryloyl group.

3. The alkali-developable resist material according to claim 1, wherein at least one of the photopolymerizable functional group is an alicyclic epoxy group or a glycidyl group.

4. The alkali-developable resist material according to claim 1, wherein at least one of the photopolymerizable functional group is an alkoxysilyl group.

5. The alkali-developable resist material according to claim 4, wherein the alkoxysilyl group is an alkoxysilylethyl group or an alkoxysilylpropyl group.

6. The alkali-developable resist material according to claim 4, wherein the alkoxysilyl group is at least one member selected from the group consisting of an (alkoxysilylethyl)dimethylsilyl group, (alkoxysilylethyl)diphenylsilyl group, (alkoxysilylpropyl)dimethylsilyl group and (alkoxysilylpropyl)diphenyl group.

7. The alkali-developable resist material according to claim 1,
   wherein the polysiloxane compound is a hydrosilylation reaction product of the following compounds (α1) to (γ1):

(α1) an organic compound having, in a molecule thereof, one or more carbon-carbon double bonds that have reactivity with SiH groups, and having, within the same molecule, at least one member selected from the group consisting of structures represented by the following formula (X1) and the following formula (X2);

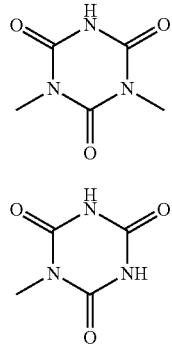

(β) a polysiloxane compound having at least two SiH groups in a molecule thereof; and
(γ1) a compound having, in a molecule thereof, at least one photopolymerizable functional group and one or more carbon-carbon double bonds that have reactivity with SiH groups.

8. The alkali-developable resist material according to claim 1, wherein the polysiloxane compound is a hydrosilylation reaction product of the following compounds (α1) to (γ1):

(α1) an organic compound having, in a molecule thereof, one or more carbon-carbon double bonds that have reactivity with SiH groups, and having, within the same molecule, at least one member selected from the group consisting of structures represented by the following formulas (X1) and the following formula (X2;

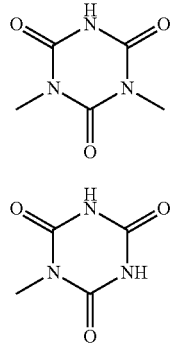

(α2) a compound having, in a molecule thereof, one or more carbon-carbon double bonds that have reactivity with SiH groups;
(β3) a polysiloxane compound having at least two SiH groups in a molecule thereof; and
(γ1) a compound having, in a molecule thereof, at least one photopolymerizable function group and one or more carbon-carbon double bonds that have reactivity with SiH groups.

9. The alkali-developable resist material according to claim 7, wherein the compound (α1) is at least one member selected from the group consisting of compounds represented by the following general formulas (I):

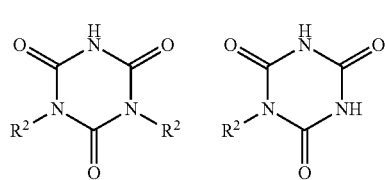

wherein, $R^2$ represents a monovalent organic group having 1 to 50 carbon atoms, each $R^2$ may be the same or different, and at least one $R^2$ contains a carbon-carbon double bond having reactivity with SiH groups.

10. The alkali-developable resist material according to claim 7, wherein the compound (α1) is at least one member selected from the group consisting of diallyl isocyanuric acid and monoallyl isocyanuric acid.

11. The alkali-developable resist material according to claim 8, wherein the compound (α2) is a compound represented by the following general formula (II):

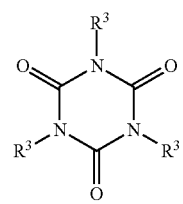

wherein, $R^3$ represents a monovalent organic group having 1 to 50 carbon atoms, each $R^3$ may be the same or different, and at least one $R^3$ contains a carbon-carbon double bond having reactivity with SiH groups.

12. The alkali-developable resist material according to claim 7, wherein the compound (β) is a cyclic polysiloxane compound having an SiH group represented by the following general formula (III):

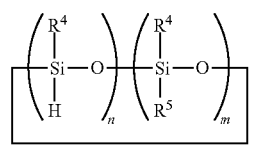

wherein, $R^4$ and $R^5$ represent organic groups having 1 to 10 carbon atoms and may be the same or different, n represents a number of 1 to 10, and m represents a number of 0 to 10.

13. The alkali-developable resist material according to claim 7, wherein the compound (γ1) is at least one member selected from the group consisting of vinylcyclohexene oxide, allyl glycidyl ether, diallyl monoglycidyl isocyanurate and monoallyl diglycidyl isocyanurate.

14. The alkali-developable resist material according to claim 7, wherein the compound (γ1) is a compound represented by the following general formula (IV):

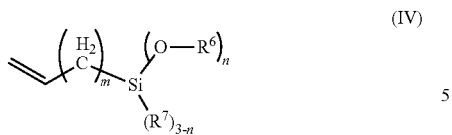 (IV)

wherein, $R^6$ and $R^7$ each represent an organic group having 1 to 6 carbon atoms, n represents a number of 1 to 3 and m represents a number of 0 to 10.

15. The alkali-developable resist material according to claim 7, wherein the compound (γ1) is allyl (meth)acrylate and/or vinyl (meth)acrylate.

16. The alkali-developable resist material according to claim 1, wherein the polysiloxane structure of the polysiloxane compound has a polyhedral backbone formed from 6 to 24 Si atoms in a molecule thereof.

17. The alkali-developable resist material according to claim 1,
wherein the photoacid generator is an onium salt.

18. The alkali-developable resist material according to claim 1, wherein the curable composition further comprises a sensitizer.

* * * * *